United States Patent
Otsuka

(10) Patent No.: US 8,633,073 B2
(45) Date of Patent: Jan. 21, 2014

(54) METHOD OF FORMING SEMICONDUCTOR DEVICE

(76) Inventor: Keisuke Otsuka, Tokyo (JP)

( * ) Notice: Subject to any disclaimer, the term of this patent is extended or adjusted under 35 U.S.C. 154(b) by 102 days.

(21) Appl. No.: 13/278,679

(22) Filed: Oct. 21, 2011

(65) Prior Publication Data

US 2013/0029467 A1    Jan. 31, 2013

(30) Foreign Application Priority Data

Jul. 29, 2011 (JP) ................. 2011-167383

(51) Int. Cl.
*H01L 21/336* (2006.01)
(52) U.S. Cl.
USPC ............ 438/259; 438/270; 257/E21.655
(58) Field of Classification Search
USPC .............. 438/259, 270, 271, 272, 589; 257/E21.655
See application file for complete search history.

(56) References Cited

U.S. PATENT DOCUMENTS

2007/0284647 A1* 12/2007 Seo et al. ............ 257/315
2011/0127603 A1* 6/2011 Burke et al. ............ 257/331

FOREIGN PATENT DOCUMENTS

| JP | 2008-004738 | 1/2008 |
| JP | 2008-300843 | 12/2008 |
| JP | 2009-164612 | 7/2009 |
| JP | 2011-054629 | 3/2011 |

* cited by examiner

*Primary Examiner* — Hoai V Pham
(74) *Attorney, Agent, or Firm* — Young & Thompson

(57) ABSTRACT

A method of forming a semiconductor device includes the following processes. A first groove is formed in a semiconductor substrate. A first conductive film is formed in the first groove and over the semiconductor substrate. The first conductive film is planarized over the semiconductor substrate. The planarized first conductive film is selectively etched to have the planarized first conductive film remain in a lower portion of the first groove.

20 Claims, 35 Drawing Sheets

METHOD OF FORMING SEMICONDUCTOR DEVICE

BACKGROUND OF THE INVENTION

1. Field of the Invention

The present invention generally relates to method of forming a semiconductor device.

Priority is claimed on Japanese Patent Application No. 2011-167383, filed Jul. 29, 2011, the content of which is incorporated herein by reference.

2. Description of the Related Art

In recent years, large scale integrated circuits have been used in computers and electronic devices. The large scale integrated circuits include a large number of MOS transistors integrated on a single semiconductor chip. Upon shrinkage of semiconductor devices such as DRAMs (dynamic random access memories), shrinkage of transistors are also required in which gate electrodes are buried in grooves in a semiconductor substrate.

Japanese Unexamined Patent Application, First Publication, No. 2011-54629 discloses that tungsten (W) and titanium nitride (TiN) are buried in grooves of a semiconductor substrate, and then the tungsten (W) and titanium nitride (TiN) are etched back to form buried gate electrodes in the grooves, where the buried gate electrode includes the tungsten (W) and titanium nitride (TiN) films.

Japanese Unexamined Patent Application, First Publication, No. 2009-164612 discloses that a first conductive layer is buried in grooves of a semiconductor substrate, and then the first conductive layer is etched back to form buried gate electrodes of the first conductive layer in the grooves.

Japanese Unexamined Patent Application, First Publication, No. 2008-300843 discloses that a gate electrode of a conductive carbon material is buried in a groove of a semiconductor substrate.

Japanese Unexamined Patent Application, First Publication, No. 2008-4738 discloses that a first gate electrode is buried in a groove of a semiconductor substrate and a second gate electrode is disposed through groove side walls.

SUMMARY

In an embodiment, a method of forming a semiconductor device may include, but is not limited to, the following processes. A first groove is formed in a semiconductor substrate. A first conductive film is formed in the first groove and over the semiconductor substrate. The first conductive film is planarized over the semiconductor substrate. The planarized first conductive film is selectively etched to have the planarized first conductive film remain in a lower portion of the first groove.

In another embodiment, a method of forming a semiconductor device may include, but is not limited to, the following processes. A plurality of device isolation regions is formed in a main surface of a semiconductor substrate, so that the plurality of device isolation regions define at least one device formation region. A first insulating film is formed. A gate electrode groove is carried out by using the first insulating film as a mask. The gate electrode groove extends in a first direction crossing the plurality of device isolation regions. A gate insulating film is formed on inside walls of the gate electrode groove. A first conductive layer is formed on the gate insulating film. The first conductive layer is in the gate electrode groove. A second conductive layer is formed on the first conductive layer. The second conductive layer fills in the gate electrode groove. A planarization film is formed over the second conductive layer. A first etching process is carried out for etching the planarization film to expose the second conductive layer. A second etching process is carried out for selectively etching the second conductive layer to have the second conductive layer remain in a lower portion of the gate electrode groove. A third etching process is carried out for selectively etching the first conductive layer to have the first conductive layer remain in the lower portion of the gate electrode groove.

In still another embodiment, the method may further include, but is not limited to, the following processes. A first burying insulating film is formed over the first and second conductive layers in the gate electrode groove, so that the first burying insulating film fills the gate electrode groove. A chemical mechanical polishing process is carried out to polish the first burying insulating film, so that a top surface of the first burying insulating film is substantially equal to the surface of the semiconductor substrate. A first inter-layer insulating film is formed over the first burying insulating film and the semiconductor substrate. A bit contact hole is formed in the first inter-layer insulating film. The bit contact hole reaches the first burying insulating film and the device formation region. The bit contact hole extends in the first direction. A third conductive layer is formed in the bit contact hole and over the first inter-layer insulating film. The third conductive layer is patterned over the first inter-layer insulating film to form a bit line which partially overlapping the first burying insulating film so that the bit line is connected to the device formation region.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
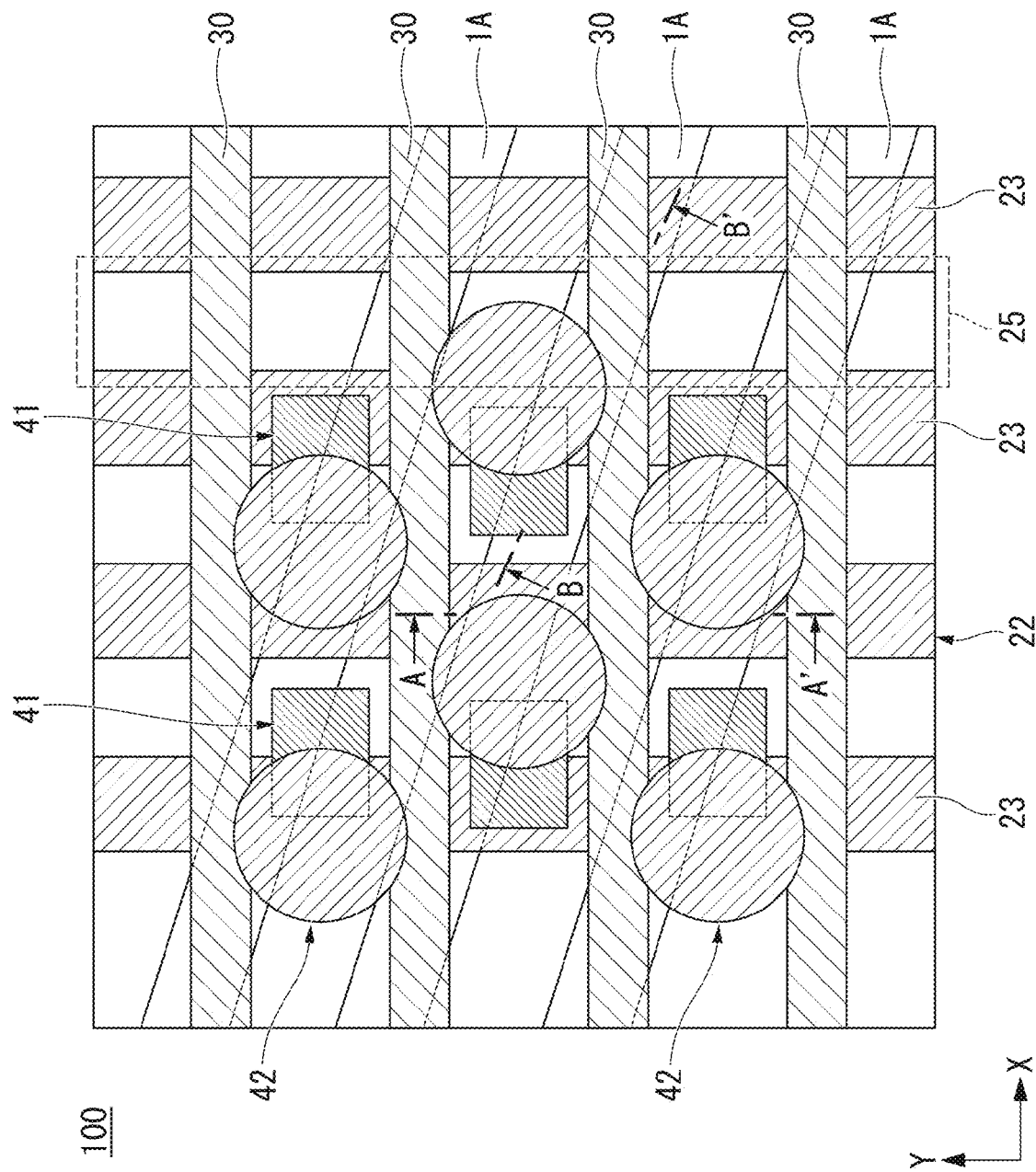
FIG. 1 is a plain view of a memory cell region of a DRAM in accordance with an embodiment of the invention.

Before describing the present invention, the related art will be explained, in order to facilitate the understanding of the embodiments of the present invention.

A gate electrode film is deposited in grooves of a semiconductor substrate and over a surface of the semiconductor substrate. The gate electrode film is etched back to form gate electrodes buried in the grooves. The gate electrode film extending in the groove and over the semiconductor substrate has variation in level of its top surface over positions. The process for etching back the gate electrode film with the variety in level of its top surface may cause variation in performances of transistors.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In an embodiment, a method of forming a semiconductor device may include, but is not limited to, the following processes. A first groove is formed in a semiconductor substrate. A first conductive film is formed in the first groove and over the semiconductor substrate. The first conductive film is planarized over the semiconductor substrate. The planarized first conductive film is selectively etched to have the planarized first conductive film remain in a lower portion of the first groove.

In some cases, the method may further include, but is not limited to, the following processes. A plurality of device isolation grooves is formed in a main surface of the semiconductor substrate. A plurality of device isolation films is formed in the plurality of device isolation grooves to form a plurality of device isolation regions and to define at least one device formation region by the plurality of device isolation regions. The process of forming the first groove may include, but is not limited to, forming the first groove which extends to cross the device formation region.

In some cases, planarizing the first conductive film may include, but is not limited to, forming a planarizing film over the first conductive film; and carrying out a first etching process under a condition that an etching rate of the planarization film to an upper portion of the first conductive film is in the range of 0.5 to 1.5.

In some cases, forming the first conductive film may include, but is not limited to, forming a first conductive layer in the first groove and over the semiconductor substrate; and forming a second conductive layer on the first conductive layer. The process of forming the planarization film may include, but is not limited to, forming the planarization film on the second conductive layer.

In some cases, carrying out the first etching process may be carried out by removing the planarization film to expose the second conductive layer.

In some cases, the first etching process is carried out under a first condition that a first etching rate of the planarization film to the second conductive layer is in the range of 0.5 to 1.5.

In some cases, the method may further include, but is not limited to, the following processes. A second etching process is carried out for selectively etching the second conductive layer to have the second conductive layer remain in a lower portion of the first groove. A third etching process is carried out for selectively etching the first conductive layer to have the first conductive layer remain in a lower portion of the first groove.

In another embodiment, a method of forming a semiconductor device may include, but is not limited to, the following processes. A plurality of device isolation regions is formed in a main surface of a semiconductor substrate, so that the plurality of device isolation regions define at least one device formation region. A first insulating film is formed. A gate electrode groove is carried out by using the first insulating film as a mask. The gate electrode groove extends in a first direction crossing the plurality of device isolation regions. A gate insulating film is formed on inside walls of the gate electrode groove. A first conductive layer is formed on the gate insulating film. The first conductive layer is in the gate electrode groove. A second conductive layer is formed on the first conductive layer. The second conductive layer fills in the gate electrode groove. A planarization film is formed over the second conductive layer. A first etching process is carried out for etching the planarization film to expose the second conductive layer. A second etching process is carried out for selectively etching the second conductive layer to have the second conductive layer remain in a lower portion of the gate electrode groove. A third etching process is carried out for selectively etching the first conductive layer to have the first conductive layer remain in the lower portion of the gate electrode groove.

In some cases, the first etching process is carried out under a first condition that an etching rate of the planarization film to the second conductive layer is in the range of 0.5 to 1.5.

In some cases, the second etching process is carried out under a second condition that etching rates of the second conductive layer to the gate insulating film and to the first conductive layer are at least 6.

In some cases, the third etching process is carried out under a third condition that etching rates of the first conductive layer to the gate insulating film and to the first insulating film are at least 6.

In some cases, the method may further include, but is not limited to, carrying out a fourth etching process for etching the first conductive layer so that a top portion of the first conductive layer is lower than a top portion of the second conductive layer, after carrying out the third etching process.

In some cases, the fourth etching process is carried out under a fourth condition that etching rates of the first conductive layer to the gate insulating film and to the first insulating film are at least 6.

In some cases, forming the planarization film may further include, but is not limited to, forming a polymer film over the second conductive layer.

In some cases, forming the polymer film may further include, but is not limited to, forming a polyphenol resin film over the second conductive layer.

In some cases, forming the polymer film may further include, but is not limited to, coating a polymer on the second conductive layer.

In some cases, at least one of the second, third and fourth etching processes is carried out by carrying out a dry etching process without applying any bias to the semiconductor substrate.

In still embodiment, the method may further include, but is not limited to, the following processes. A first burying insulating film is formed over the first and second conductive layers in the gate electrode groove, so that the first burying insulating film fills the gate electrode groove. A chemical mechanical polishing process is carried out to polish the first burying insulating film, so that a top surface of the first burying insulating film is substantially equal to the surface of the semiconductor substrate. A first inter-layer insulating film is formed over the first burying insulating film and the semiconductor substrate. A bit contact hole is formed in the first inter-layer insulating film. The bit contact hole reaches the first burying insulating film and the device formation region. The bit contact hole extends in the first direction. A third conductive layer is formed in the bit contact hole and over the first inter-layer insulating film. The third conductive layer is patterned over the first inter-layer insulating film to form a bit line which partially overlapping the first burying insulating film so that the bit line is connected to the device formation region.

In some cases, the method may further include, but is not limited to, forming a capacitive contact plug in the first inter-layer insulating film. The capacitive contact plug partially overlaps the first burying insulating film. The capacitive contact plug is adjacent to the bit line.

In some cases, the method may further include, but is not limited to, forming a capacitor connected to the capacitive contact plug.

An embodiment of the present invention will be described with reference to the drawings. An example of a DRAM formed by a method of the embodiment will be described.

Figure 2A:
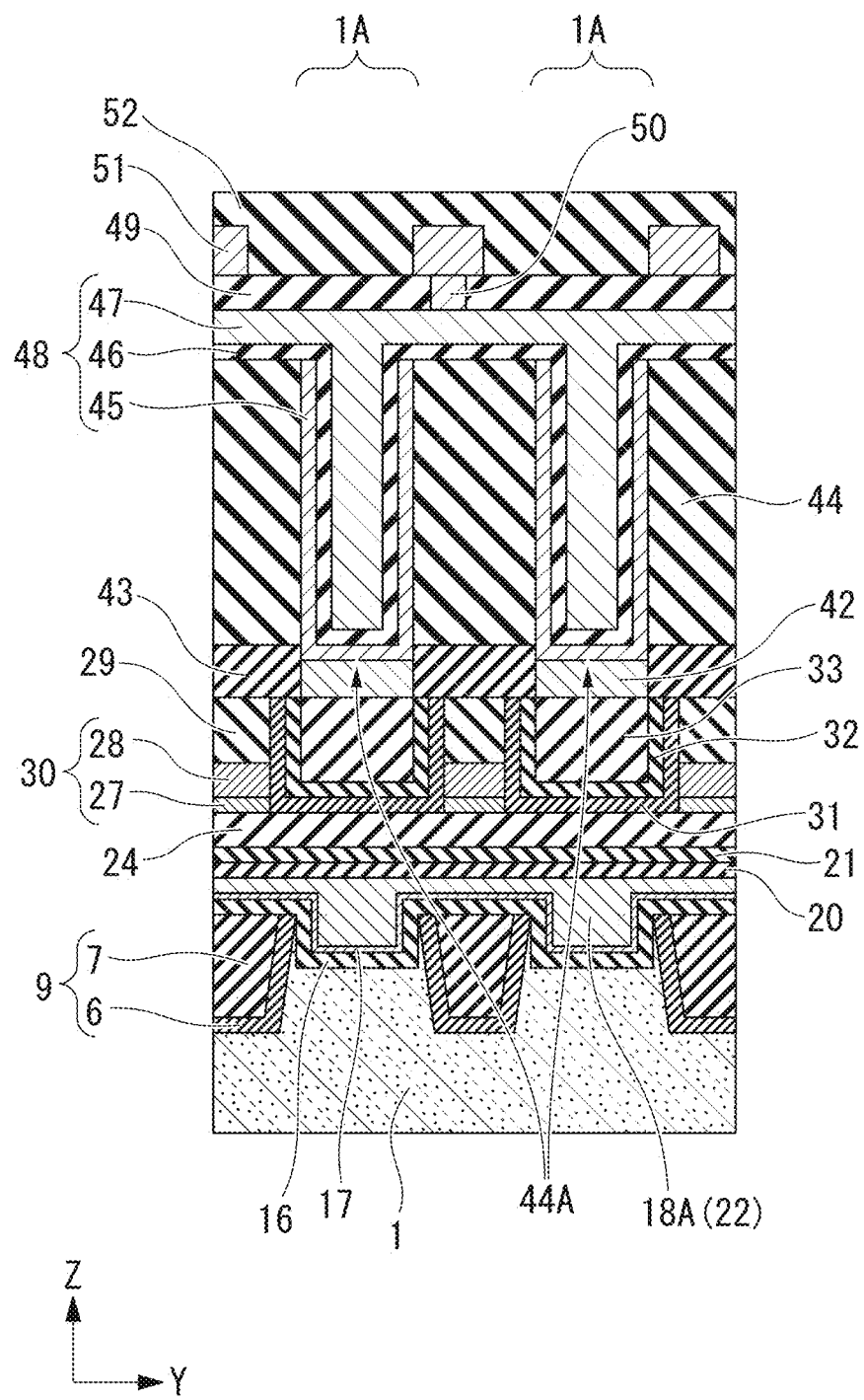
FIG. 2A is a fragmentary cross sectional elevation view of the memory cell region of the DRAM, taken along an A-A' line of FIG. 1.
Figure 2B:
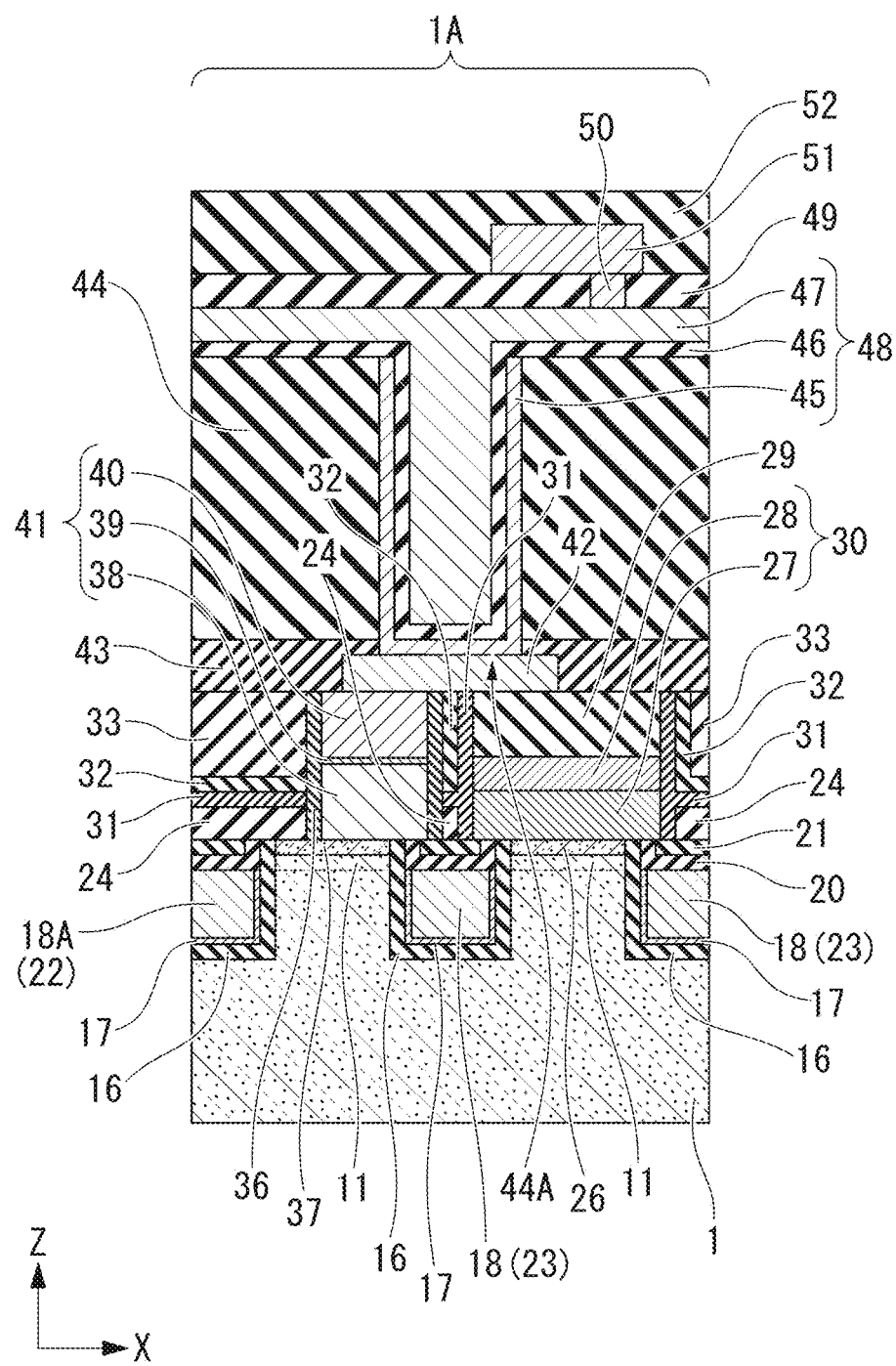
FIG. 2B is a fragmentary cross sectional elevation view of the memory cell region of the DRAM, taken along a B-B' line of FIG. 1.

FIG. 1 is a fragmentary plain view of a memory cell region of a DRAM in accordance with an embodiment of the invention. Capacitors and upper metal interconnects are not illustrated in FIG. 1, wherein the capacitors are positioned over capacitive contact pads and the upper metal interconnects are positioned over the capacitors. FIG. 2A is a fragmentary cross sectional elevation view of the memory cell region of the DRAM, taken along an A-A' line of FIG. 1. The A-A' line is parallel to the Y-direction of FIG. 1. FIG. 2B is a fragmentary cross sectional elevation view of the memory cell region of the DRAM, taken along a B-B' line of FIG. 1. The B-B' line is oblique to the X-direction of FIG. 1.

A DRAM 100 includes a semiconductor substrate which may be a silicon substrate in this example. A wafer to be used hereinafter will mean a structure including not only the semiconductor substrate but also any other elements formed over the semiconductor substrate or any structures including the semiconductor substrate during fabrication processes.

The DRAM 100 includes a memory cell region and a peripheral region. The peripheral region is disposed outside the memory cell region. Driver transistors are disposed in the peripheral region.

The DRAM 100 includes planer MOS transistors over a silicon substrate 1. The structure of the MOS transistor will be described.

The MOS transistor is disposed in an active region 1A which may also be referred to as a device formation region. The active region 1A is surrounded and defined by a device isolation region such as a shallow trench isolation (STI) 9. The STI 9 includes a stack of insulating films 6 and 7 which are in grooves of the silicon substrate 1.

The MOS transistor includes a gate insulating film 16 which covers inner walls of a gate electrode groove in the active region 1A. The MOS transistor includes an intervening layer 17 which will also be referred to as a first conductive layer 17. The first conductive layer 17 is disposed on the gate insulating film 16. The MOS transistor includes a second conductive layer 18 on the first conductive layer 17. The second conductive layer 18 buries a lower portion of the gate electrode groove. The second conductive layer 18 will perform a buried word line 23. The MOS transistor includes diffusion regions 26 and 37 to perform as source and drain regions. The diffusion regions 26 and 37 are disposed in a low impurity concentration diffusion region 11 in the active region 1A.

The low impurity concentration diffusion region 11 is formed in an upper portion of the active region 1A which is not covered by the gate insulating film 16. The low impurity concentration diffusion region 11 has a diffused impurity of an opposite conductivity type to a majority impurity included in the silicon substrate 1. The second conductive film 18 has a top surface which is covered by a liner film 20 which is further covered by a burying insulating film 21.

FIGS. 2A and 2B show only two MOS transistors including the buried word lines 23. In actual DRAM, the cell array includes several thousands of MOS transistors or several hundred thousands of MOS transistors. A second conductive layer 18A shown in FIG. 2B has the same structure as the second conductive layer 18 which performs the buried word line 23. The second conductive layer 18A is not to perform any word line. The second conductive layer 18A is to perform a buried line 22 which electrically separates the MOS transistors. The buried line 22 is fixed at a voltage level to keep a parasitic transistor in OFF which electrically separates adjacent MOS transistors from each other.

Upper structures over the MOS transistors will then be described.

The cell array region of the DRAM 100 includes a plurality of memory cells, each having the above-described MOS transistor and a capacitor 48 coupled to the MOS transistor.

The capacitor 48 may be a cylindrically-shaped capacitor. The capacitor 48 includes a bottom electrode 45, a capacitive insulating film 46 and a top electrode 47. The bottom electrode 45 is cylindrically-shaped. The bottom electrode 45 has an inner wall and an outer wall. The bottom electrode 45 has inner walls which defines an inside space which is filled with the capacitive insulating film 46 and the top electrode 47.

The diffusion region 26 of the MOS transistor is connected to a lower conductive film 27 which is disposed over the diffusion region 26. The cell array region of the DRAM 100 includes bit lines 30, each including the lower conductive film 27 and an upper conductive film 28. The bit line 30 has an upper surface which is covered by a mask film 29. The bit line 30 has side surfaces which are covered by insulating films 31. The diffusion region 37 of the MOS transistor is connected to the bottom electrode 45 of the capacitor 48 through a capacitor contact plug 41 and a capacitor contact pad 42. The capacitor contact plug 41 is disposed over the diffusion region 37. The capacitor contact plug 41 includes a stacked structure of conductive films 38 and 40 and an intervening layer 39 interposed between the conductive films 38 and 40. The capacitor contact plug 41 has side surfaces which are covered by side wall insulating films 36. The capacitor contact pad 42 is to ensure an alignment margin between the capacitor 48 and the capacitor contact plug 41. The capacitor contact pad 42 does not need to cover an upper surface of the capacitor contact plug 41. The capacitor contact pad 42 may be disposed over the capacitor contact plug 41, so that the capacitor contact pad 42 is connected to at least a part of the capacitor contact plug 41.

The stack of the bit line 30 and the mask film 29 has side surfaces which are covered by a first interlayer insulating film 24, the insulating film 31, the liner film 32 and a coating insulating film 33. The coating insulating film 33 will hereinafter be referred to as a spin-on-dielectric (SOD) 33. The capacitor contact plug 41 has side surfaces which are covered by a first interlayer insulating film 24, the insulating film 31, the liner film 32 and the spin-on-dielectric (SOD) 33. The capacitor contact pad 42 is covered by a stopper film 43 which is to protect the SOD 33. A third interlayer insulating film 44 is disposed over the stopper film 43. A cylindrical hole 44A penetrates the third interlayer insulating film 44 and the stopper film 43. The cylindrical hole 44A is covered by the bottom electrode 45. The bottom electrode 45 has the outer surfaces which are adjacent to the third interlayer insulating film 44 and the stopper film 43. The third interlayer insulating film 44 has an upper surface which is covered by the capacitive insulating film 46. The capacitive insulating film 46 has a surface which is covered by the top electrode 47.

The top electrode 47 is covered by a fourth interlayer insulating film 49. A contact plug 50 is provided in the fourth interlayer insulating film 49. An interconnect 51 is provided over the fourth interlayer insulating film 49. The interconnect 51 may hereinafter be referred to as a top metal interconnect. The top electrode 47 of the capacitor 48 is connected to the top metal interconnect 51 through the contact plug 50. The top metal interconnect 51 and the fourth interlayer insulating film 49 are covered by a protection film 52.

The MOS transistor described above has the buried word line which is suitable for shrinkage in occupied area in the cell array region as compared to the planer MOS transistor.

A method of forming the DRAM 100 described above will be described with reference to FIGS. 3A through 28B.

(Formations of Device Isolation Regions and Diffusion Regions)

Figure 3A:
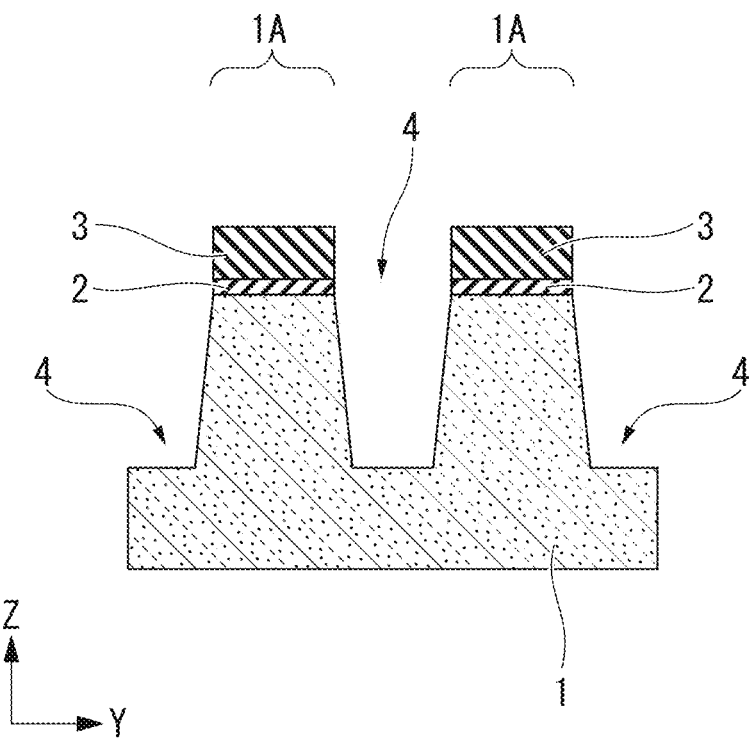
FIG. 3A is a fragmentary cross sectional elevation view of a step involved in a method of forming the DRAM, taken along the A-A' line of FIG. 1.
Figure 3B:
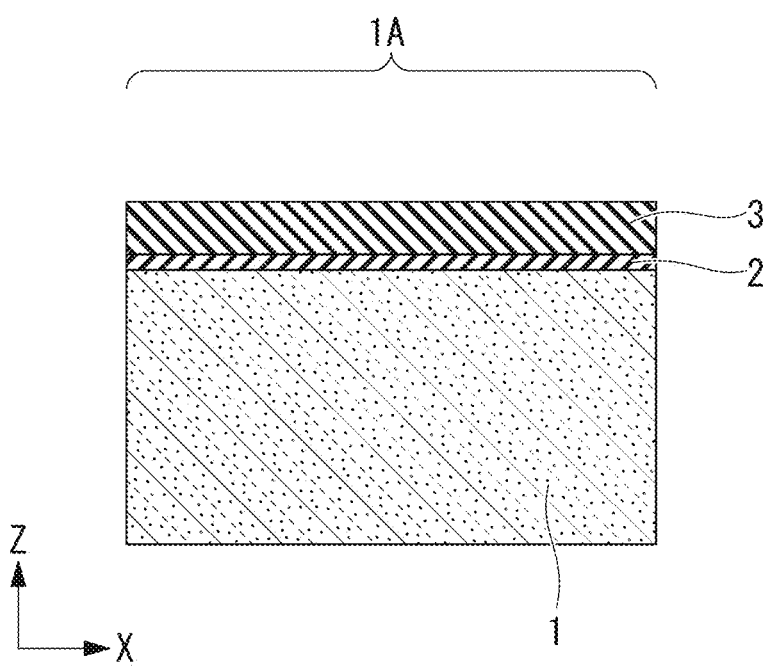
FIG. 3B is a fragmentary cross sectional elevation view of the same step as the step of FIG. 3A, involved in the method of forming the DRAM, taken along the B-B' line of FIG. 1.

As shown in FIGS. 3A and 3B, a semiconductor substrate 1 such as a p-type silicon substrate is prepared. A dummy film 2 is formed on a surface of the semiconductor substrate 1. A mask film 3 is formed on the dummy film 2. A photolithography process and a dry etching process are carried out to pattern the mask film 3, the dummy film 2 and the semiconductor substrate 1, to form device isolation grooves 4 in the semiconductor substrate 1. The device isolation grooves 4 define active regions 1A. The device isolation grooves 4 extend in a direction crossing the X-direction as the second direction and the Y-direction as the first direction. In the plan view, the device isolation grooves 4 form line patterns which extend in the direction crossing the X-direction as the second direction and the Y-direction as the first direction. The active regions 1A remain covered by the mask film 3. The expression "extend a particular direction" means including not only a case where an element extends straightforward in the particular direction, but also modified cases where the element extends not-straightforward but generally in the particular direction, for example, the element with a curved-shape or a wave-shape extends not-straightforward but generally in the particular direction.

The dummy film 2 can be a silicon oxide film ($SiO_2$) formed by a thermal oxidation process. The mask film 3 can be a silicon nitride film ($Si_3N_4$) formed by a thermal chemical vapor deposition method.

Figure 4A:
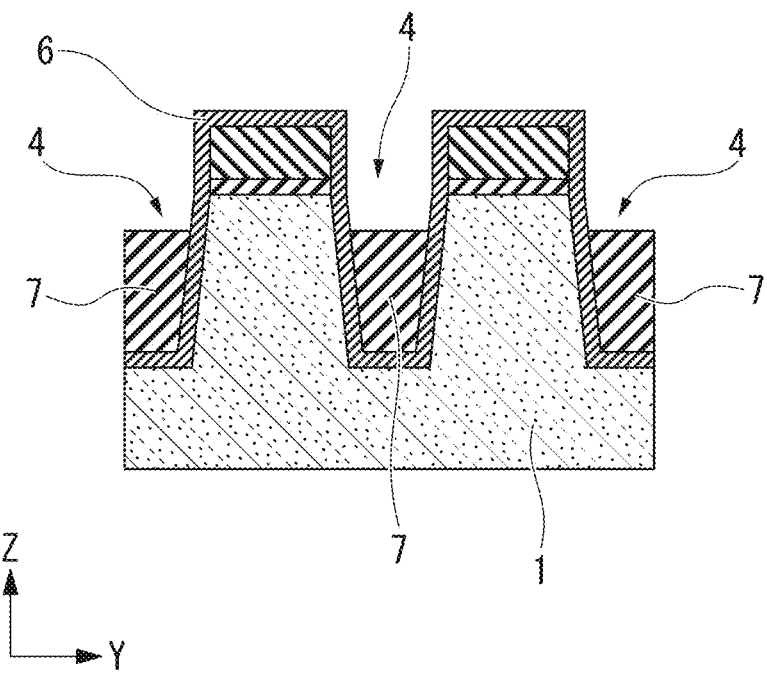
FIG. 4A is a fragmentary cross sectional elevation view of a step, subsequent to the step of FIGS. 3A and 3B, involved in a method of forming the DRAM, taken along the A-A' line of FIG. 1.
Figure 4B:
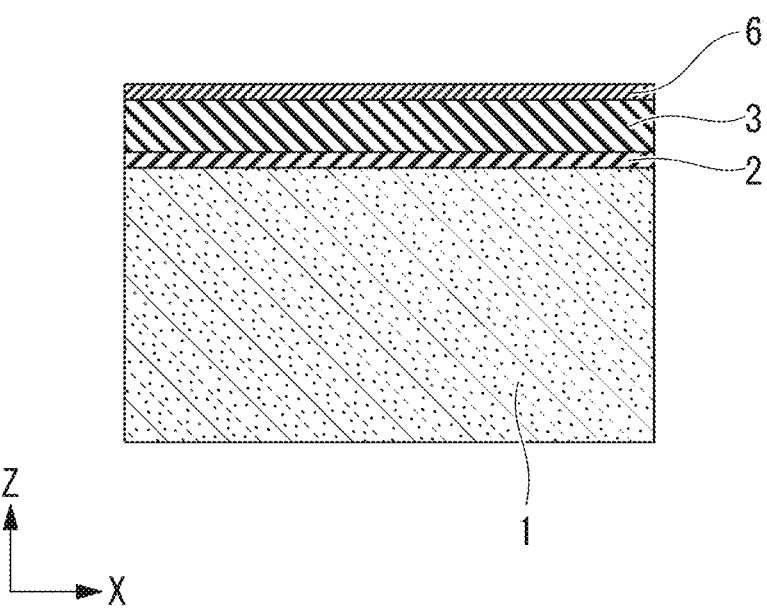
FIG. 4B is a fragmentary cross sectional elevation view of the same step as the step of FIG. 4A, involved in the method of forming the DRAM, taken along the B-B' line of FIG. 1.

As shown in FIGS. 4A and 4B, a device isolation insulating film 6 is formed on the surface of the semiconductor substrate 1 and the surface of the mask film 3. An insulating film 7 is formed on the device isolation insulating film 6. The insulating film 7 buries the device isolation grooves 4 and over the mask film 3. The insulating film 7 is then etched back to reside in the device isolation grooves 4 only.

The device isolation insulating film 6 can be a silicon oxide film ($SiO_2$) formed by a thermal oxidation process. The insulating film 7 can be a silicon nitride film ($Si_3N_4$) formed by a thermal chemical vapor deposition method.

Figure 5A:
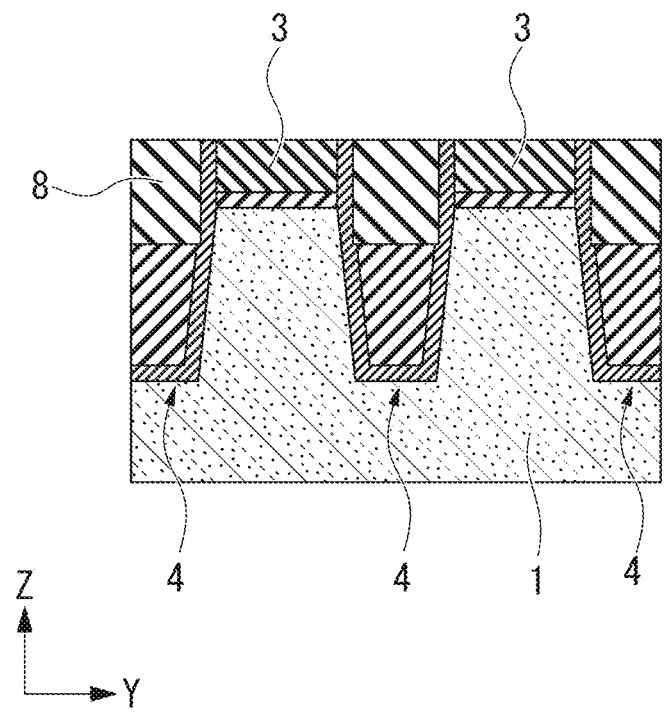
FIG. 5A is a fragmentary cross sectional elevation view of a step, subsequent to the step of FIGS. 4A and 4B, involved in a method of forming the DRAM, taken along the A-A' line of FIG. 1.
Figure 5B:
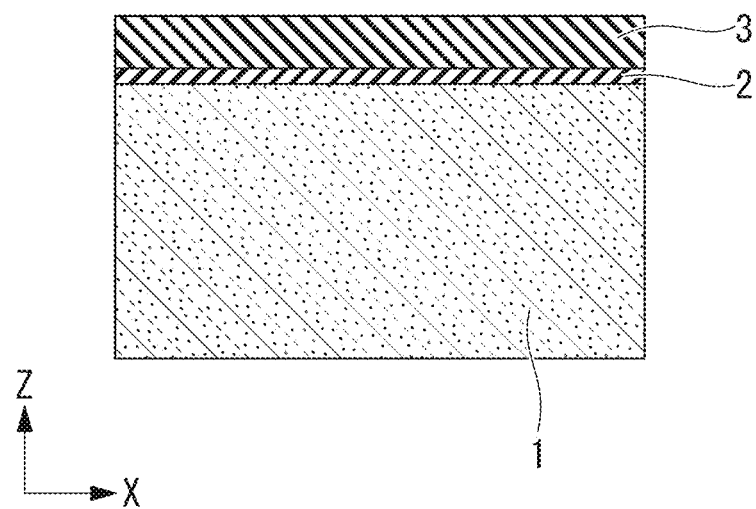
FIG. 5B is a fragmentary cross sectional elevation view of the same step as the step of FIG. 5A, involved in the method of forming the DRAM, taken along the B-B' line of FIG. 1.

As shown in FIGS. 5A and 5B, a burying insulating film 8 is formed on the insulating film 7, so that the burying insulating film 8 buries the device isolation grooves 4 and over the device isolation insulating film 6 over the mask film 3. A chemical mechanical polishing process is carried out to polish the burying insulating film 8 and the device isolation insulating film 6 over the mask film 3, so as to expose the mask film 3 over the active regions 1A. The burying insulating film 8 is planarized by the chemical mechanical polishing process.

The burying insulating film 8 can be a silicon oxide film ($SiO_2$) formed by a plasma chemical vapor deposition method.

Figure 6A:
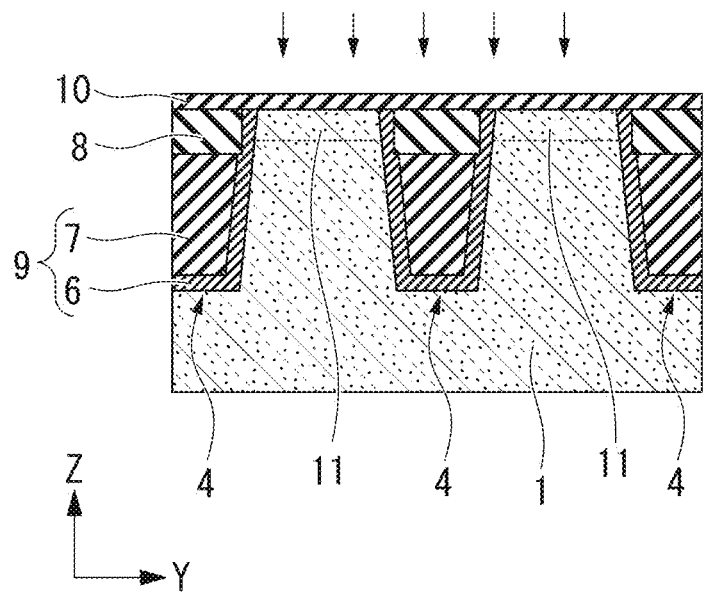
FIG. 6A is a fragmentary cross sectional elevation view of a step, subsequent to the step of FIGS. 5A and 5B, involved in a method of forming the DRAM, taken along the A-A' line of FIG. 1.
Figure 6B:
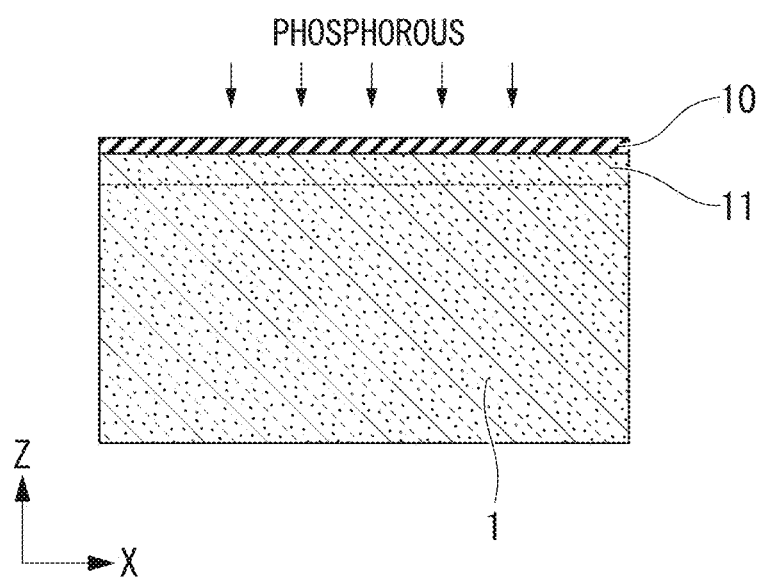
FIG. 6B is a fragmentary cross sectional elevation view of the same step as the step of FIG. 6A, involved in the method of forming the DRAM, taken along the B-B' line of FIG. 1.

As shown in FIGS. 6A and 6B, a device isolation region 9 is formed as follows. A wet etching process is carried out to remove the mask film 3 ad the dummy film 2, and an upper portion of the burying insulating film 8, so that the upper surface of the burying insulating film 8 in the device isolation grooves 4 has almost the same level as the top surface of the semiconductor substrate 1, thereby forming the device isolation regions 9 in line-shape. The device isolation regions 9 are shallow trench isolations. The device isolation regions 9 electrically separate the active regions 1A from each other. In this step, the device isolation region 9 includes the device isolation insulating film 6, the insulating film 7 and the burying insulating film 8. In later step, the burying insulating film 8 will be etched so that the device isolation region 9 will have included the device isolation insulating film 6 and the insulating film 7. Thus, FIG. 6A shows the device isolation region 9 includes the device isolation insulating film 6 and the insulating film 7, and excluding the burying insulating film 8.

A dummy film 10 is formed over the wafer, so that the dummy film 10 covers the top surfaces of the burying insulating film 8 and the top surfaces of the active regions 1A of the semiconductor substrate 1. An ion-implantation process is carried out by introducing an n-type impurity such as phosphorous ions into the active regions 1A, thereby forming n-type low impurity concentration diffusion regions 11 in the active regions 1A. The low impurity concentration diffusion regions 11 will perform as source and drain regions.

The dummy film 10 can be a silicon oxide film ($SiO_2$) formed by a thermal oxidation process.

(Formation of Buried Word Line)

Figure 7A:
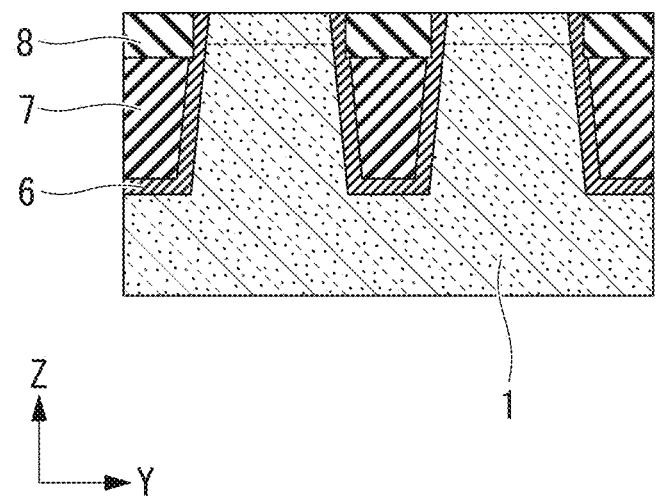
FIG. 7A is a fragmentary cross sectional elevation view of a step, subsequent to the step of FIGS. 6A and 6B, involved in a method of forming the DRAM, taken along the A-A' line of FIG. 1.
Figure 7B:
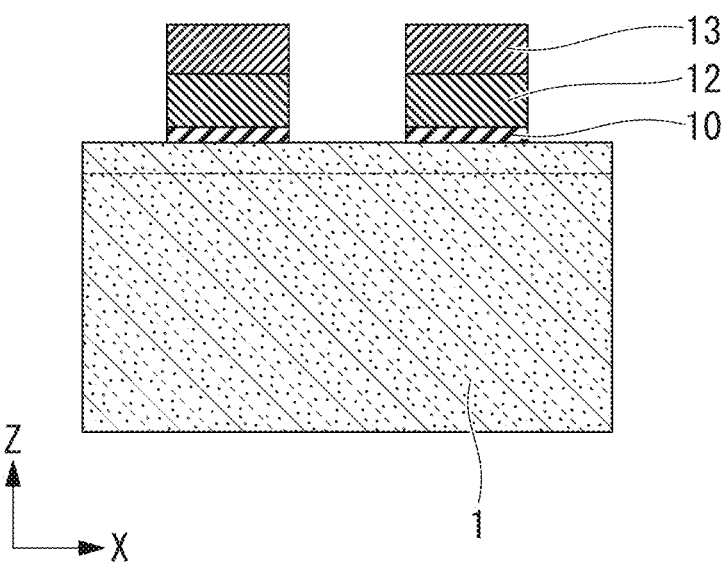
FIG. 7B is a fragmentary cross sectional elevation view of the same step as the step of FIG. 7A, involved in the method of forming the DRAM, taken along the B-B' line of FIG. 1.

As shown in FIGS. 7A and 7B, a lower mask film 12 is formed on the dummy film 10. An upper mask film 13 is formed on the lower mask film 12. The stack of the lower and upper mask films 12 and 13 form a first insulating film. The stack of the dummy film 10 and the lower and upper mask films 12 and 13 is patterned to form a hard mask which is to be used to form gate electrode grooves.

The lower mask film 12 can be a silicon nitride film (SiN) formed by a chemical vapor deposition method. The upper mask film 13 can be a carbon film or an amorphous carbon film which is formed by a plasma chemical vapor deposition method.

Figure 8A:
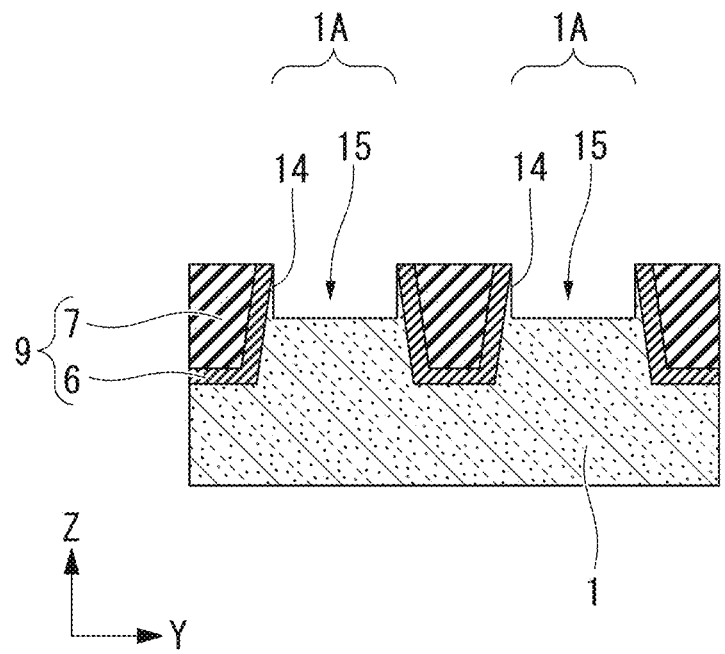
FIG. 8A is a fragmentary cross sectional elevation view of a step, subsequent to the step of FIGS. 7A and 7B, involved in a method of forming the DRAM, taken along the A-A' line of FIG. 1.
Figure 8B:
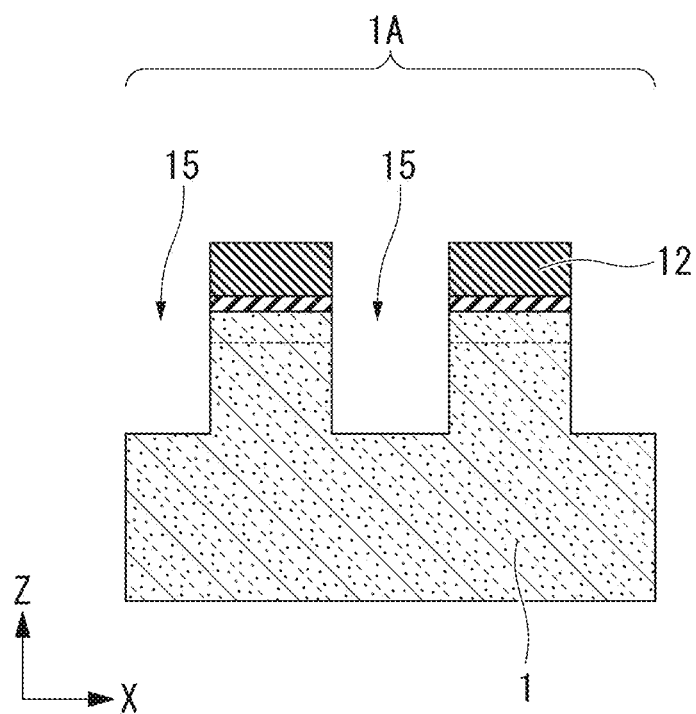
FIG. 8B is a fragmentary cross sectional elevation view of the same step as the step of FIG. 8A, involved in the method of forming the DRAM, taken along the B-B' line of FIG. 1.

As shown in FIGS. 8A and 8B, a dry etching process is carried out by using the hard mask to selectively etch the semiconductor substrate 1 to form gate electrode grooves 15 in the semiconductor substrate 1. The gate electrode grooves 15 are line-patterns which extend across the active regions 1A. The gate electrode grooves 15 extend in the Y-direction.

The upper surface of the device isolation region 9 in the device isolation groove 4 is also etched by the dry etching process, so that the device isolation region 9 has an upper surface which is lower than the upper surface of the semiconductor substrate 1. The dry etching process can be carried out under conditions that the insulating film 6 and the burying insulating film 8, the both being made of silicon oxide, are slower in etching rate than the semiconductor substrate 1. In this case, the gate electrode groove 15 has bottom surfaces which have different levels. The gate electrode groove 15 has a deeper bottom surface in the semiconductor substrate 1 and a shallower bottom surface in the device isolation region 9. The deeper bottom surface is bounded by a step from the shallower bottom surface. As shown in FIG. 8A, the gate electrode groove 15 has side walls defined by thin residual portions of the semiconductor substrate 1. The thin residual portions of the semiconductor substrate 1 are adjacent to the device isolation regions 9. The thin residual portions of the semiconductor substrate 1 provide channel regions 14 of the recessed transistor. The lower mask film 12 resides over the semiconductor substrate 1 except over the gate electrode grooves 15.

Figure 9A:
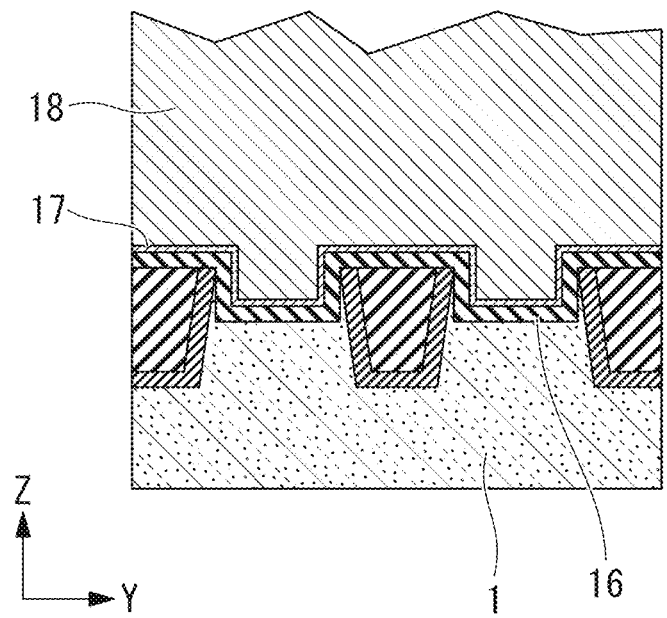
FIG. 9A is a fragmentary cross sectional elevation view of a step, subsequent to the step of FIGS. 8A and 8B, involved in a method of forming the DRAM, taken along the A-A' line of FIG. 1.
Figure 9B:
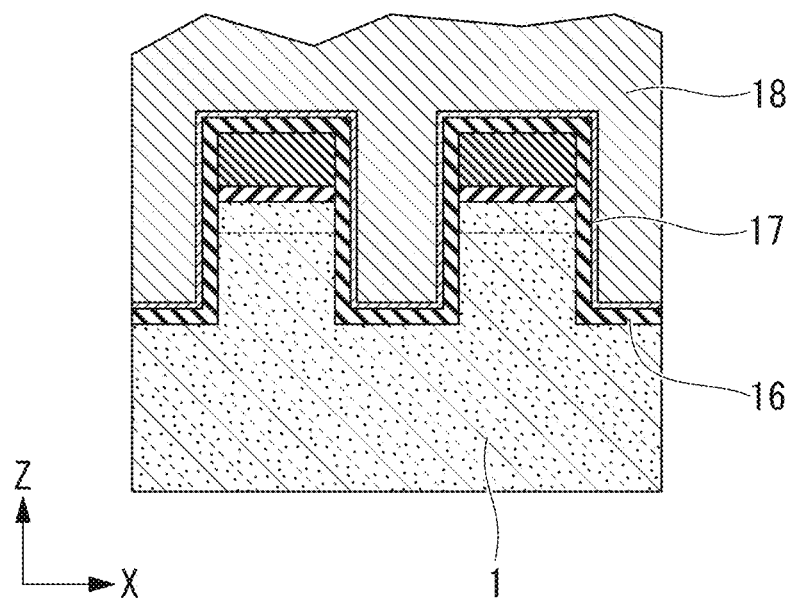
FIG. 9B is a fragmentary cross sectional elevation view of the same step as the step of FIG. 9A, involved in the method of forming the DRAM, taken along the B-B' line of FIG. 1.

As shown in FIGS. 9A and 9B, a gate insulating film 16 is formed on exposed surfaces which include side walls of the gate electrode grooves 15 and the device isolation regions 9. The gate insulating film 16 covers the inside walls of the gate electrode grooves 15. The gate insulating film 16 will have performed a gate insulating film of buried gate MOS transistor in the memory cell region.

The gate insulating film 16 can be a silicon oxide film ($SiO_2$) formed by a thermal oxidation process.

An intervening layer 17 as a first conductive layer 17 is formed on the gate insulating film 16.

The intervening layer 17 can be a titanium nitride layer formed by a chemical vapor deposition method. The intervening layer 17 can also be a crystal silicon layer such as a polysilicon layer formed by a chemical vapor deposition method.

A conductive layer 18 as a second conductive layer 18 is formed on the first conductive layer 17. The second conductive layer 18 buries the gate electrode grooves 15.

The second conductive layer 18 can be a tungsten layer (W) formed by a chemical vapor deposition method. The second conductive layer 18 can also be an aluminum layer (Al) formed by a chemical vapor deposition method.

The second conductive layer 18 has a non-flat upper surface which has variation in level. The variation in level of the non-flat upper surface over the wafer may be about 40 nm at maximum.

Figure 10A:
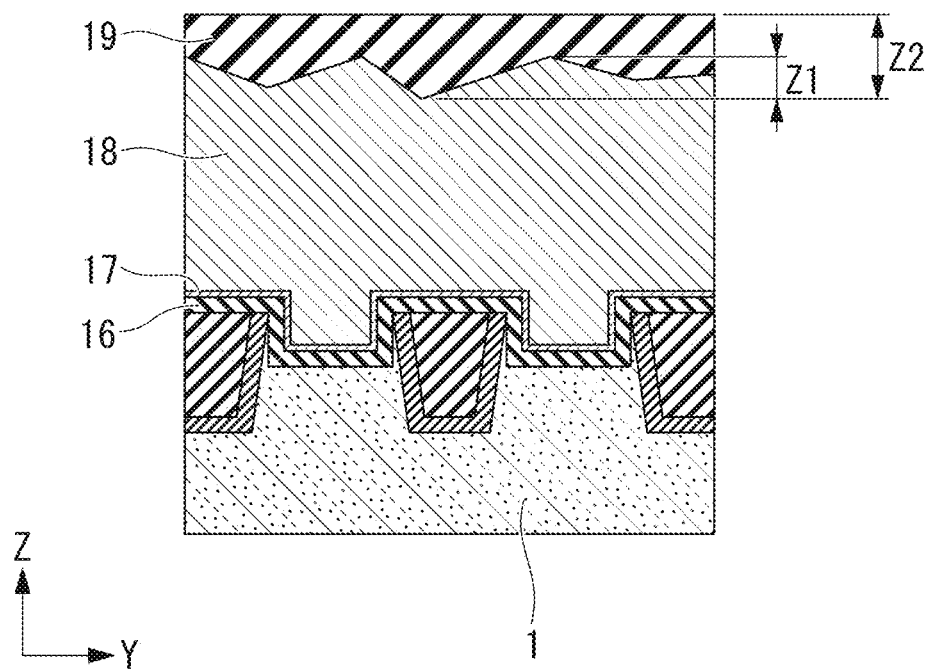
FIG. 10A is a fragmentary cross sectional elevation view of a step, subsequent to the step of FIGS. 9A and 9B, involved in a method of forming the DRAM, taken along the A-A' line of FIG. 1.
Figure 10B:
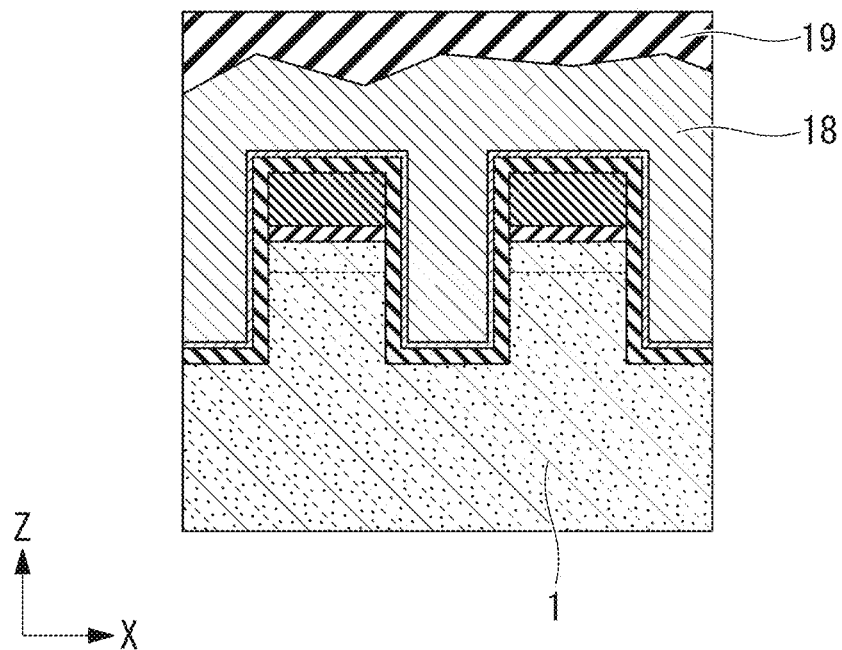
FIG. 10B is a fragmentary cross sectional elevation view of the same step as the step of FIG. 10A, involved in the method of forming the DRAM, taken along the B-B' line of FIG. 1.

As shown in FIGS. 10A and 10B, a cover film 19 as a planarization film 19 is then coated on the non-flat upper surface of the second conductive layer 18. The planarization film 19 can be made of a material which will reduce the variation in level of the non-flat upper surface of the wafer. Preferably, the material will ensure a planarized surface of the wafer.

Typical examples of the materials for the planarization film 19 may include, but are not limited to, polymers, and for example, anti-reflection films such as bottom anti-reflective coating films, which contain, as a main component, novolac polyphenol reins dissolved in an organic solvent. In this case, the thickness Z2 of the planarization film 19 can preferably be in the range of 1 time to 2 times of, and more preferably about 2 times of the maximum variation in level of the non-flat upper surface of the wafer. The coating resin will flow to bury the non-flat upper surface of the wafer, and will obtain a planarized surface of the wafer. In view of the planarization, the thickness Z2 of the planarization film 19 can be more than 2 times of the maximum variation in level of the non-flat upper surface of the wafer. In view of throughput of the semiconductor device, the thickness Z2 of the planarization film 19 is preferably 2 times of the maximum variation in level of the non-flat upper surface of the wafer. Preferably, a baking process is further carried out at a temperature in the range of 175° C. to 240° C. and for a time in the range of 60 seconds to 90 seconds, in order to volatilize the solvent, and to prevent the flow of the resin.

The materials for the planarization film 19 may be polyimide reins, spin-on-dielectric (SOD) and silicon dioxide ($SiO_2$) by the plasma chemical vapor deposition.

Figure 11A:
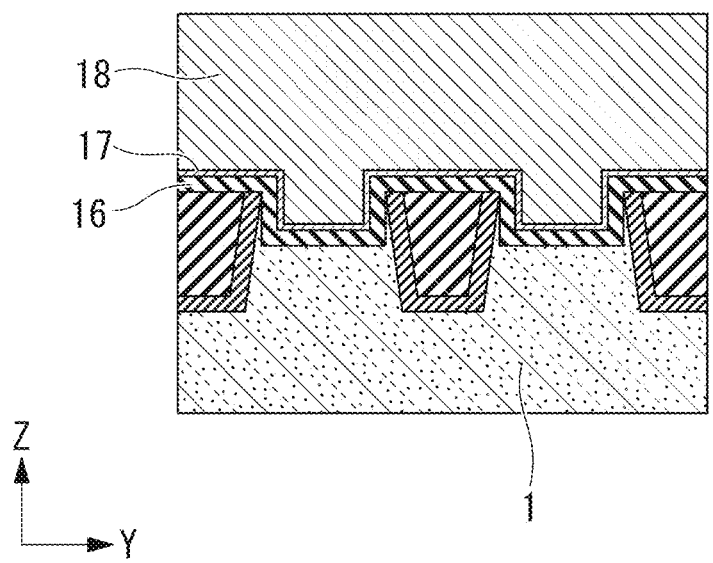
FIG. 11A is a fragmentary cross sectional elevation view of a step, subsequent to the step of FIGS. 10A and 10B, involved in a method of forming the DRAM, taken along the A-A' line of FIG. 1.
Figure 11B:
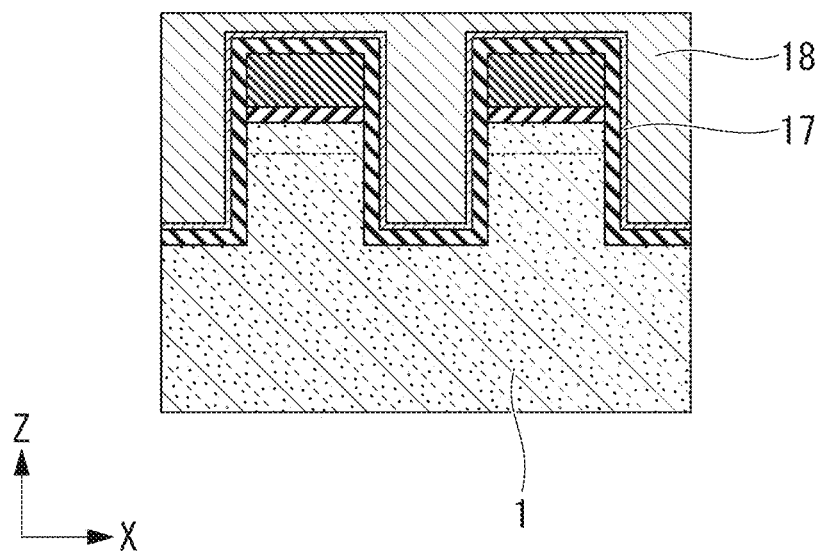
FIG. 11B is a fragmentary cross sectional elevation view of the same step as the step of FIG. 11A, involved in the method of forming the DRAM, taken along the B-B' line of FIG. 1.

As shown in FIGS. 11A and 11B, a dry etching process is carried out as a first etching process to remove the planarization film 19 to expose the second conductive layer 18.

The first dry etching process can be carried out by a reactive ion etching (RIE) method using inductively coupled plasma (ICP).

The first dry etching process can preferably be carried out under conditions that a selective ratio of the second conductive layer 18 to the planarization film 19 is approximately 1, so as to etch the second conductive layer 18 and the planarization film 19 at approximately the same etching rate, resulting in that the residual portion of the second conductive layer 18 will have a flat surface. For example, the conditions for the dry etching process to obtain approximately the same etching rate ratio of the second conductive layer 18 to the planarization film 19 may be as follows. The source power is in the range of 600 W to 1200 W. The high frequency power is in the range of 50 W to 200 W. The pressure is in the range of 4 mTorr to 20 mTorr. The process gases are sulfur hexafluoride ($SF_6$), oxygen ($O_2$) and argon (Ar), the flow rates of sulfur hexafluoride ($SF_6$), oxygen ($O_2$) and argon (Ar) are 70 sccm ($SF_6$), 30 sccm ($O_2$) and 120 sccm (Ar). The selection ratio of the second conductive layer 18 to the planarization film 19 is preferably approximately 1 to ensure the planarization. The selection ratio the second conductive layer 18 to the planarization film 19 in the range of 0.5 to 1.5 is still effective to reduce the variation in level of the non-flat upper surface of the second conductive layer 18.

The second conductive layer 18 can preferably reside at a thickness of at least 10 nm over the intervening layer 17 as the first conductive layer 17, in order to avoid that the intervening layer 17 be exposed and oxidized. The thickness of the residual portion of the second conductive layer 18 over the intervening layer 17 can be adjusted by adjusting the process time of the dry etching process.

Figure 12A:
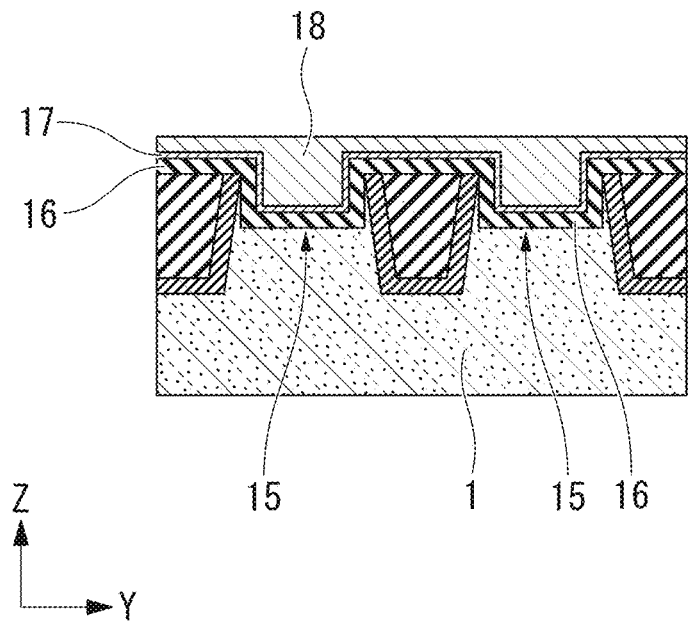
FIG. 12A is a fragmentary cross sectional elevation view of a step, subsequent to the step of FIGS. 11A and 11B, involved in a method of forming the DRAM, taken along the A-A' line of FIG. 1.
Figure 12B:
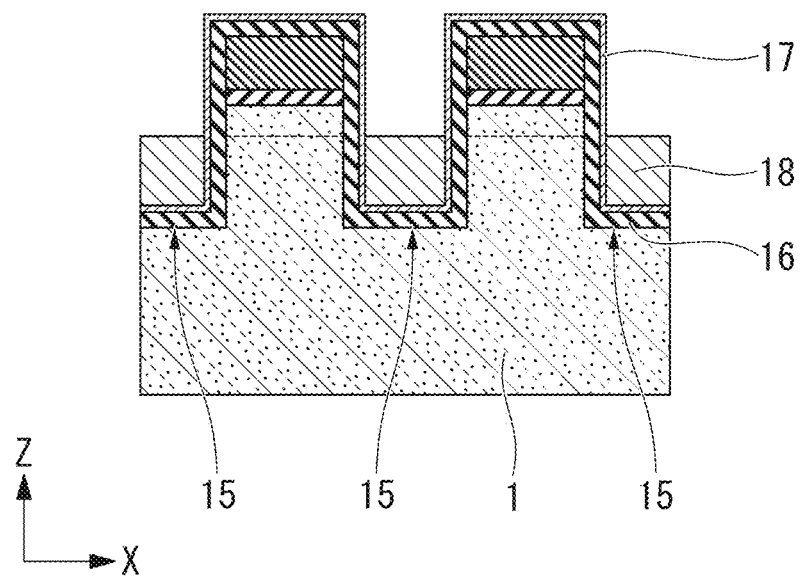
FIG. 12B is a fragmentary cross sectional elevation view of the same step as the step of FIG. 12A, involved in the method of forming the DRAM, taken along the B-B' line of FIG. 1.

As shown in FIGS. 12A and 12B, a second dry etching process is carried out to remove an upper portion of the second conductive layer 18 so that the second conductive layer 18 resides in a lower portion of the gate electrode grooves 15.

The residual portions of the second conductive layer 18 in the lower portion of the gate electrode grooves 15 may be, for example, about 100 nm.

The second dry etching process can be carried out by a reactive ion etching (RIE) method using inductively coupled plasma (ICP).

The second dry etching process can preferably be carried out under conditions that a selective ratio of the second conductive layer 18 to the first conductive layer 17 as the intervening layer and to the gate insulating film 16 is at least 6, so as to etch the first conductive layer 17 as the intervening layer and the gate insulating film 16, avoiding any damage from being applied to the active regions 1A.

For example, the conditions for the second dry etching process to obtain the selection ratio of at least 6 may be as follows. The source power is 300 W. The high frequency power is 0 W. The pressure is in the range of 4 mTorr to 20 mTorr. The process gases are sulfur hexafluoride ($SF_6$), and argon (Ar), the flow rates of sulfur hexafluoride ($SF_6$) and argon (Ar) are 60 sccm($SF_6$) and 160 sccm (Ar) so as to apply no bias to the wafer under 0 W of the high frequency power. The selection ratio of the second conductive layer 18 to the planarization film 19 is preferably approximately 1 to ensure the planarization. The selection ratios of the second conductive layer 18 to the first conductive layer 17 as the intervening layer and to the gate insulating film 16 is at least 6.

The thickness of the residual portion of the second conductive layer 18 can be adjusted by adjusting the process time of the dry etching process.

Figure 13A:
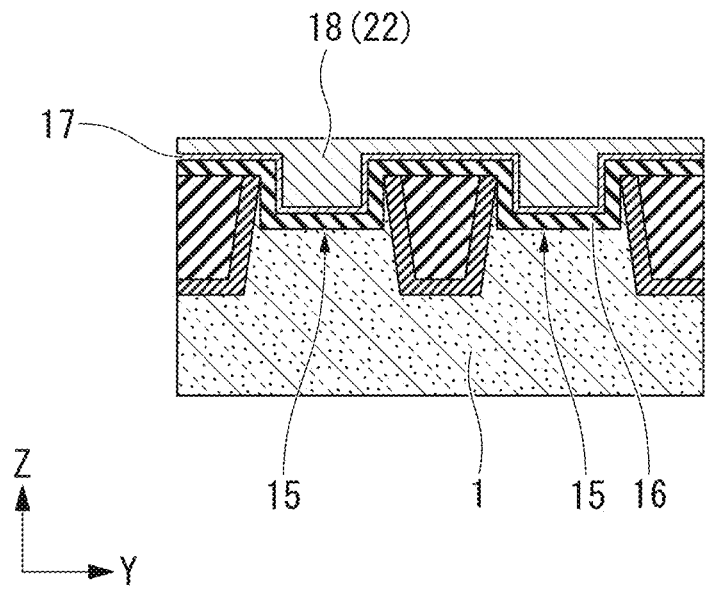
FIG. 13A is a fragmentary cross sectional elevation view of a step, subsequent to the step of FIGS. 12A and 12B, involved in a method of forming the DRAM, taken along the A-A' line of FIG. 1.
Figure 13B:
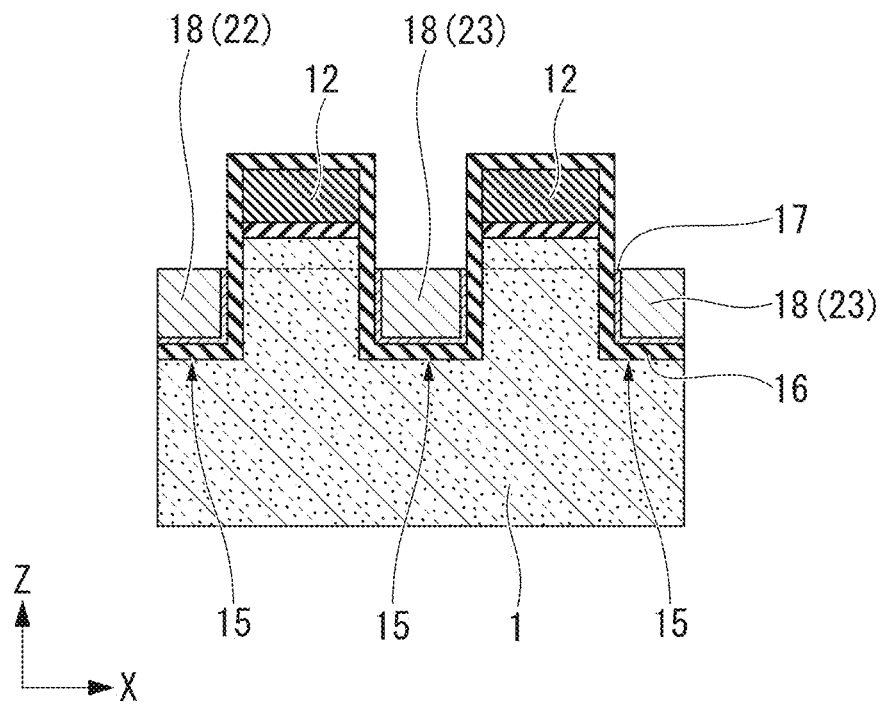
FIG. 13B is a fragmentary cross sectional elevation view of the same step as the step of FIG. 13A, involved in the method of forming the DRAM, taken along the B-B' line of FIG. 1.

As shown in FIGS. 13A and 13B, a third dry etching process is carried out to remove an upper portion of the first conductive layer 17 as the intervening layer so that the first conductive layer 17 resides at substantially the same upper surface level as the upper surface level of the residual portion of the second conductive layer 18.

The third dry etching process can be carried out by a reactive ion etching (RIE) method using inductively coupled plasma (ICP).

The third dry etching process can preferably be carried out under conditions that a selective ratio of the first conductive layer 17 as the intervening layer to the gate insulating film 16 and to the lower mask film 12 is at least 6, so as to etch the first conductive layer 17 as the intervening layer in the upper portion of the gate electrode grooves 15 and to reside the first conductive layer 17 as the intervening layer in the lower portion of the gate electrode grooves 15, as well as to avoid removals of the gate insulating film 16 and the lower mask film 12 and avoid any damage from being applied to the active regions 1A. A larger etching ratio of the first conductive layer 17 as the intervening layer to the second conductive layer 18 is preferable. For example, the etching ratio of the first conductive layer 17 as the intervening layer to the second conductive layer 18 is preferably at least 2.

For example, the conditions for the third dry etching process to obtain the selection ratio of at least 6 may be as follows. The source power is in the range of 100 W to 700 W. The high frequency power is 0 W. The pressure is in the range of 4 mTorr to 20 mTorr. The process gases are chloride ($Cl_2$), and argon (Ar), the flow rates of chloride ($Cl_2$) and argon (Ar) are 140 sccm($Cl_2$) and 60 sccm (Ar) so as to apply no bias to the wafer under 0 W of the high frequency power. The selection ratio of the first conductive layer 17 as the intervening layer to the gate insulating film 16 and to the lower mask film 12 is at least 6.

The thickness of the residual portion of the first conductive layer 17 as the intervening layer can be adjusted by adjusting the process time of the dry etching process.

As a result of the above described dry etching processes, the buried word line 23 as the gate electrode and the buried interconnect 22 are formed in lower portions of the gate electrode grooves 15. The buried word line 23 as the gate electrode and the buried interconnect 22 each include the first and second conductive layers 17 and 18 which have substantially the same upper surface level as each other.

Figure 29A:
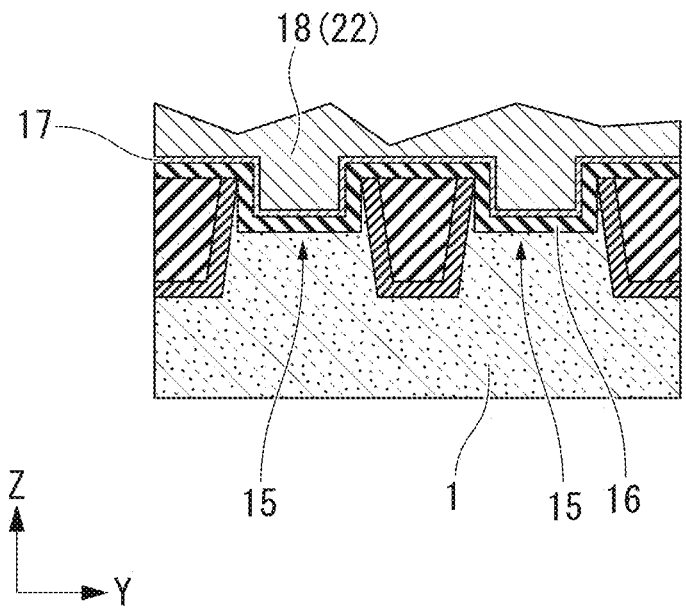
FIG. 29A is a fragmentary cross sectional elevation view of a step, subsequent to the step of FIGS. 9A and 9B, involved in a method of forming the DRAM in the related art.
Figure 29B:
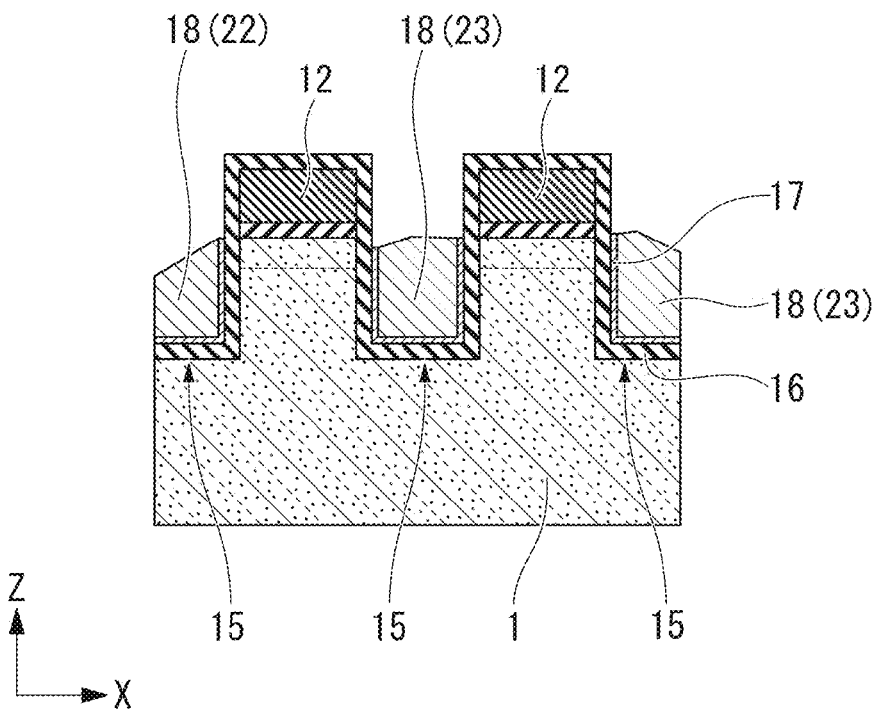
FIG. 29B is a fragmentary cross sectional elevation view of the same step as the step of FIG. 29A, involved in the method of forming the DRAM in the related art.

Contrary to the embodiment, if the cover film 19 as the planarization film 19 were not to be coated on the second conductive layer 18 and then the second conductive layer 18 is partially etched by the above described dry etching process, then the residual portion of the second conductive layer 18 still has the non-flat upper surface as shown in FIGS. 29A and 29B, resulting in variations in level of the upper surfaces of the buried word line 23 as the gate electrode and the buried interconnect 22. The upper surfaces of the first conductive layer 17 as the intervening layer in the gate electrode grooves 15 are different in level from each other by the variations in level of the residual portion of the second conductive layer 18. Thus, the buried word line 23 as the gate electrode and the buried interconnect 22 are different in interconnect capacitance from each other, resulting in variations of electric characteristics of the semiconductor device.

Figure 14A:
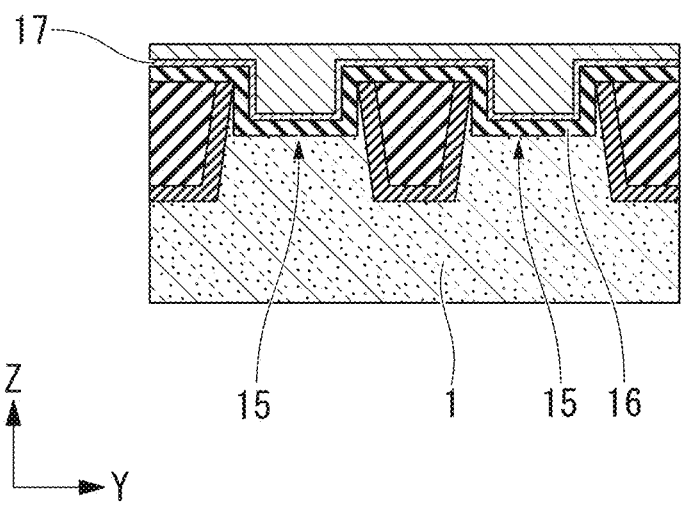
FIG. 14A is a fragmentary cross sectional elevation view of a step, subsequent to the step of FIGS. 13A and 13B, involved in a method of forming the DRAM, taken along the A-A' line of FIG. 1.
Figure 14B:
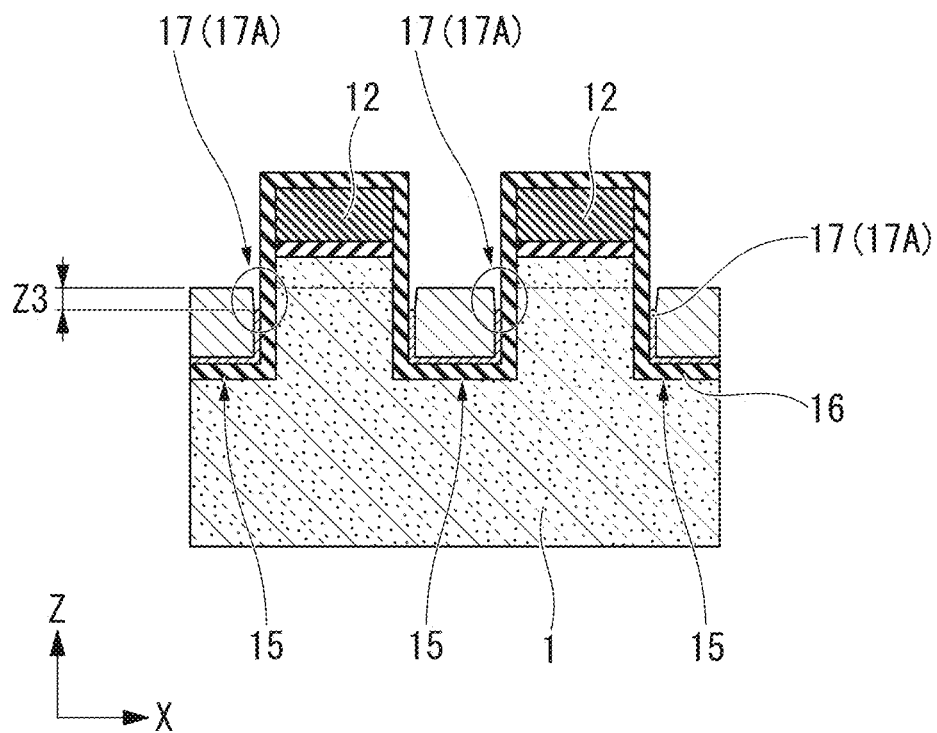
FIG. 14B is a fragmentary cross sectional elevation view of the same step as the step of FIG. 14A, involved in the method of forming the DRAM, taken along the B-B' line of FIG. 1.

As shown in FIGS. 14A and 14B, a fourth dry etching process is carried out to remove a portion of the residual portion of the first conductive layer 17 as the intervening layer in the gate electrode groove 15. The fourth dry etching process is carried out to adjust the upper surface level of the first conductive layer 17 so as to adjust the interconnect capacitances of the buried word line 23 as the gate electrode and the buried interconnect 22. The residual portion 17A of the first conductive layer 17 has the adjusted upper surface level, while the removed portion thereof is illustrated in a circle mark in FIG. 14B.

The fourth dry etching process can be carried out by a reactive ion etching (RIE) method using inductively coupled plasma (ICP).

The fourth dry etching process can preferably be carried out under conditions that a selective ratio of the first conductive layer 17 as the intervening layer to the gate insulating film 16 and to the lower mask film 12 is at least 6, so as to etch the upper portion of the first conductive layer 17 as the intervening layer in the lower portion of the gate electrode grooves 15, as well as to avoid removals of the gate insulating film 16 and the lower mask film 12 and avoid any damage from being applied to the active regions 1A. A larger etching ratio of the first conductive layer 17 as the intervening layer to the second conductive layer 18 is preferable. For example, the etching ratio of the first conductive layer 17 as the intervening layer to the second conductive layer 18 is preferably at least 2.

For example, the conditions for the fourth dry etching process to obtain the selection ratio of at least 6 may be as follows. The source power is in the range of 300 W to 1200 W. The high frequency power is 0 W. The pressure is in the range of 4 mTorr to 20 mTorr. The process gases are chloride ($Cl_2$), and argon (Ar), the flow rates of chloride ($Cl_2$) and argon (Ar) are 140 sccm($Cl_2$) and 60 sccm (Ar) so as to apply no bias to the wafer under 0 W of the high frequency power. The selection ratio of the first conductive layer 17 as the intervening layer to the gate insulating film 16 and to the lower mask film 12 is at least 6. The height Z3 of recesses over the residual portions 17A of the first conductive layer 17 in the lower portions of the gate electrode grooves 15 can be adjusted by adjusting the process time of the dry etching process.

If the source power is limited to be at most 500 W, any damage to the gate insulating film 16 under the first conductive layer 17 can effectively be reduced.

Figure 30A:
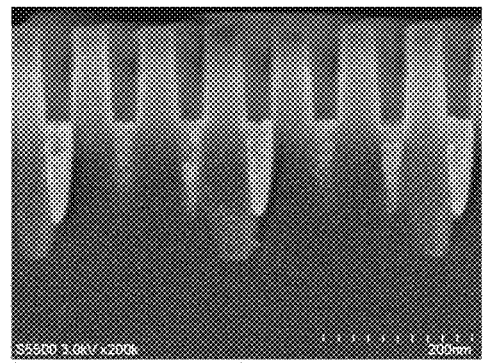
FIG. 30A is an image, obtained by an electron microscope, of a side edge portion of the semiconductor device in the step of FIGS. 14A and 14B.
Figure 30B:
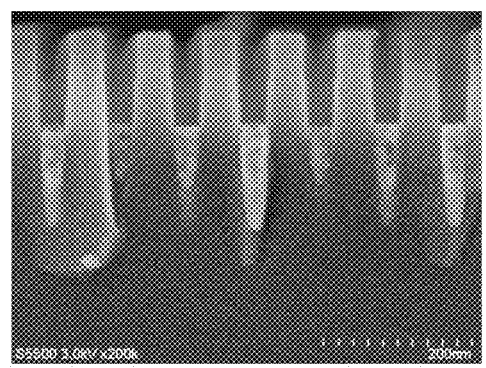
FIG. 30B is an image, obtained by the electron microscope, of an intermediate portion between the side edge portion and the center portion of the semiconductor device in the step of FIGS. 14A and 14B.
Figure 30C:
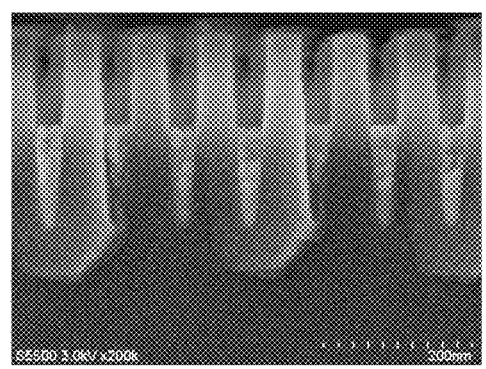
FIG. 30C is an image, obtained by the electron microscope, of the center portion of the semiconductor device in the step of FIGS. 14A and 14B.

FIG. 30A is an image, obtained by an electron microscope, of a side edge portion of the semiconductor device in the step of FIGS. 14A and 14B. FIG. 30B is an image, obtained by the electron microscope, of an intermediate portion between the side edge portion and the center portion of the semiconductor device in the step of FIGS. 14A and 14B. FIG. 30C is an image, obtained by the electron microscope, of the center portion of the semiconductor device in the step of FIGS. 14A and 14B. FIGS. 30A, 30B and 30C show that the second conductive layers 18 in the lower portions of the gate electrode grooves 15 have substantially the same upper surface level as each other.

Figure 15A:
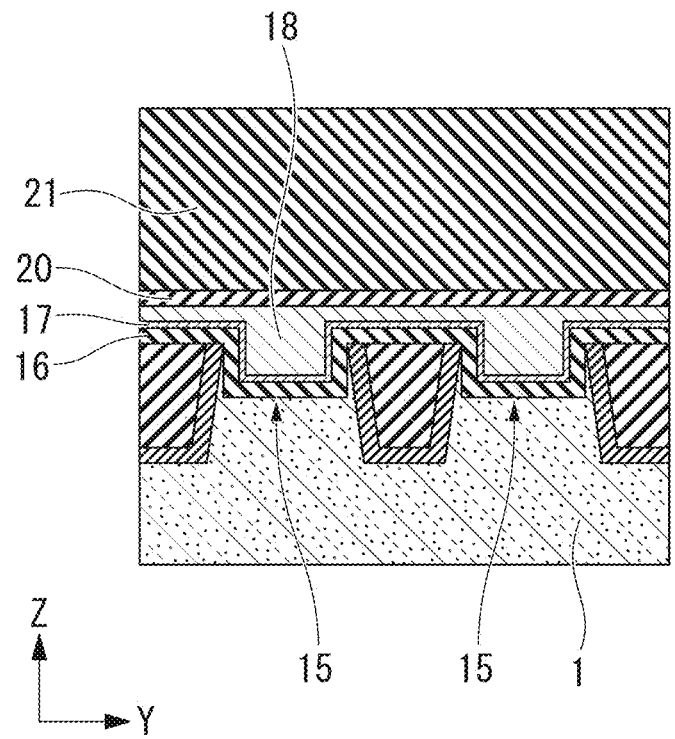
FIG. 15A is a fragmentary cross sectional elevation view of a step, subsequent to the step of FIGS. 14A and 14B, involved in a method of forming the DRAM, taken along the A-A' line of FIG. 1.
Figure 15B:
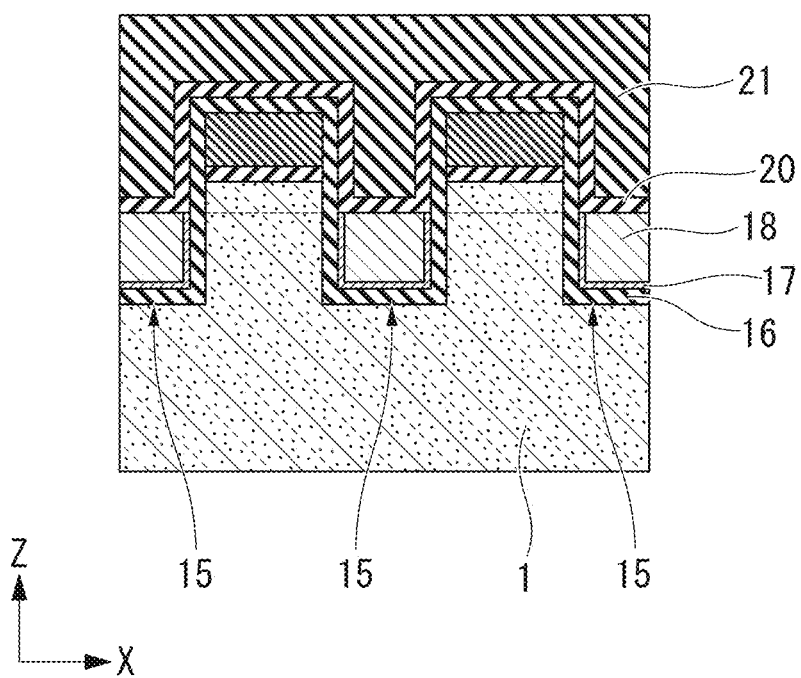
FIG. 15B is a fragmentary cross sectional elevation view of the same step as the step of FIG. 15A, involved in the method of forming the DRAM, taken along the B-B' line of FIG. 1.

As shown in FIGS. 15A and 15B, a liner film 20 is formed on exposed surfaces which include the inside walls of the gate electrode grooves 15 and the second conductive films 18 in the gate electrode grooves 15.

The liner film 20 can be a silicon nitride film ($Si_3N_4$) formed by a thermal chemical vapor deposition method.

A first buried insulating film 21 is formed which covers the liner film 20 and buries the gate electrode grooves 15.

The first buried insulating film 21 can be a silicon oxide film ($SiO_2$) formed by a plasma chemical vapor deposition method. The first buried insulating film 21 can also be a spin-on-dielectric (SOD) film. The first buried insulating film 21 can also be a multi-layered film including the silicon oxide film ($SiO_2$) formed by a plasma chemical vapor deposition method and the spin-on-dielectric (SOD) film. If the spin-on-dielectric (SOD) film is used, an anneal is carried out in an steamed atmosphere ($H_2O$) to improve the quality of the film.

Figure 16A:
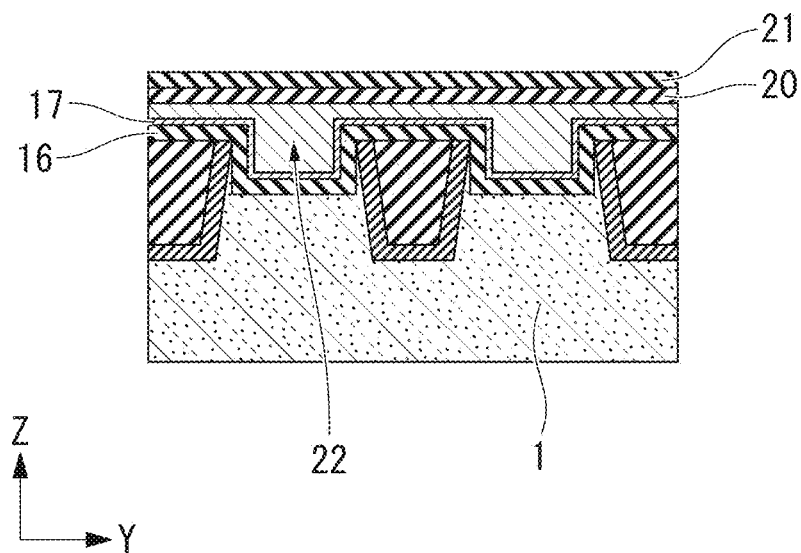
FIG. 16A is a fragmentary cross sectional elevation view of a step, subsequent to the step of FIGS. 15A and 15B, involved in a method of forming the DRAM, taken along the A-A' line of FIG. 1.
Figure 16B:
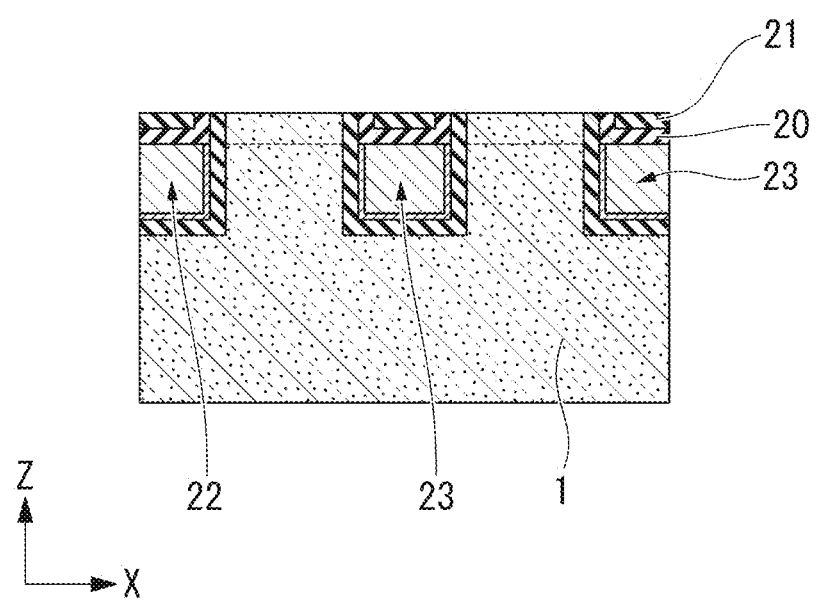
FIG. 16B is a fragmentary cross sectional elevation view of the same step as the step of FIG. 16A, involved in the method of forming the DRAM, taken along the B-B' line of FIG. 1.

As shown in FIGS. 16A and 16B, a chemical mechanical polishing process is carried out to polish the first buried insulating film 21 to expose the liner film 20. The mask film 3, the first buried insulating film 21 and the liner film 20 are partially removed so that the uppermost surface of the first buried insulating film 21 is substantially the same in level as the silicon surface of the semiconductor substrate 1.

The above process results in that the upper surfaces of the buried word line 23 as the gate electrode and the buried interconnect 22 are insulated.

The buried word line 23 as the gate electrode and the buried interconnect 22 are covered by a cap insulating film which includes the first buried insulating film 21 and the liner film 20.

(Formation of Bit Line)

Figure 17A:
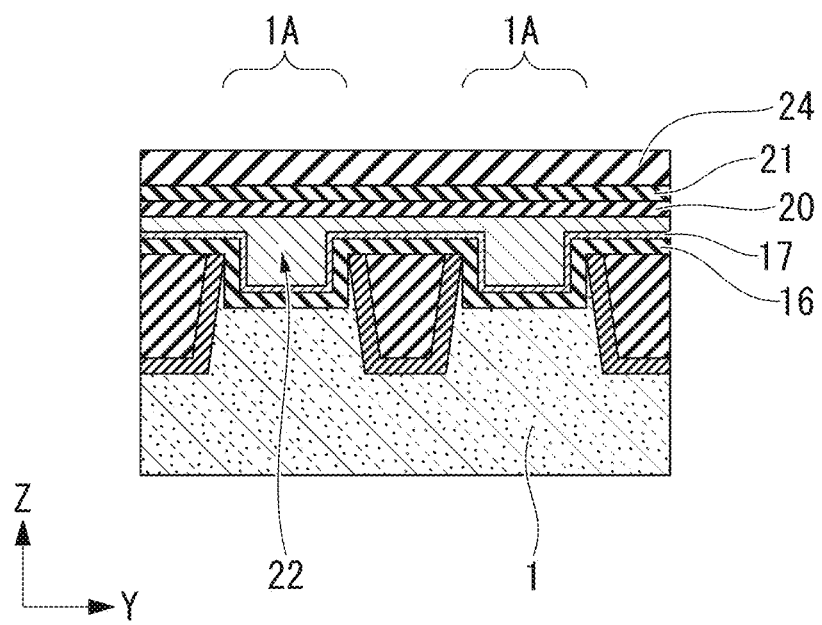
FIG. 17A is a fragmentary cross sectional elevation view of a step, subsequent to the step of FIGS. 16A and 16B, involved in a method of forming the DRAM, taken along the A-A' line of FIG. 1.
Figure 17B:
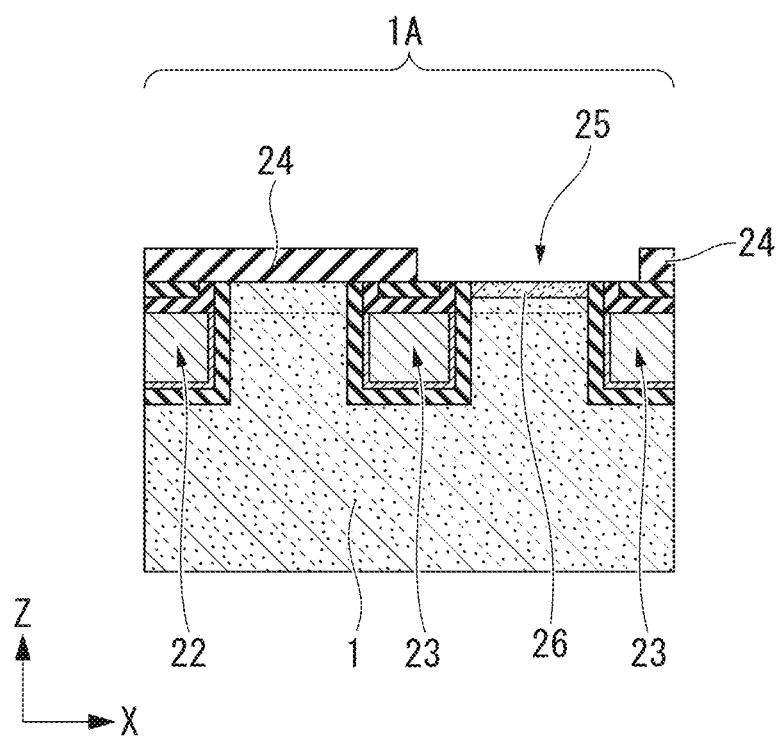
FIG. 17B is a fragmentary cross sectional elevation view of the same step as the step of FIG. 17A, involved in the method of forming the DRAM, taken along the B-B' line of FIG. 1.

As shown in FIGS. 17A and 17B, an n-type diffusion layer 26 is formed on the n-type low impurity concentration diffusion layer 11.

A first inter-layer insulating film 24 of silicon oxide is formed by a plasma chemical vapor deposition method so that the first inter-layer insulating film 24 covers the surface of the semiconductor substrate 1 and the cap insulating film. The first inter-layer insulating film 24 covers the step between the surface of the semiconductor substrate 1 and the surface of the cap insulating film. The first inter-layer insulating film 24 is so formed as to have a flat upper surface.

The first inter-layer insulating film 24 is selectively removed by a lithography process and a dry etching process to form a bit contact opening 25. The bit contact opening 25 is formed in a line-pattern which extends in the Y-direction along which the buried word line 23 also extends. At the position where the pattern of the bit contact opening 25 crosses the active region 1A, the n-type low impurity concentration diffusion region 11 in the shallow region of the semiconductor substrate 1 is exposed. An ion-implantation process is carried out by using the first inter-layer insulating film 24 as a mask to introduce an n-type ion such as arsenic through the bit contact opening 24 into the surface of the semiconductor substrate 1, thereby forming an n-type diffusion layer 26 in the vicinity of the surface of the semiconductor substrate 1. The n-type diffusion layer 26 has a higher impurity concentration than that of the low impurity concentration diffusion region 11. The n-type diffusion layer 26 is to perform one of source and drain diffusion regions of the transistor.

Figure 18A:
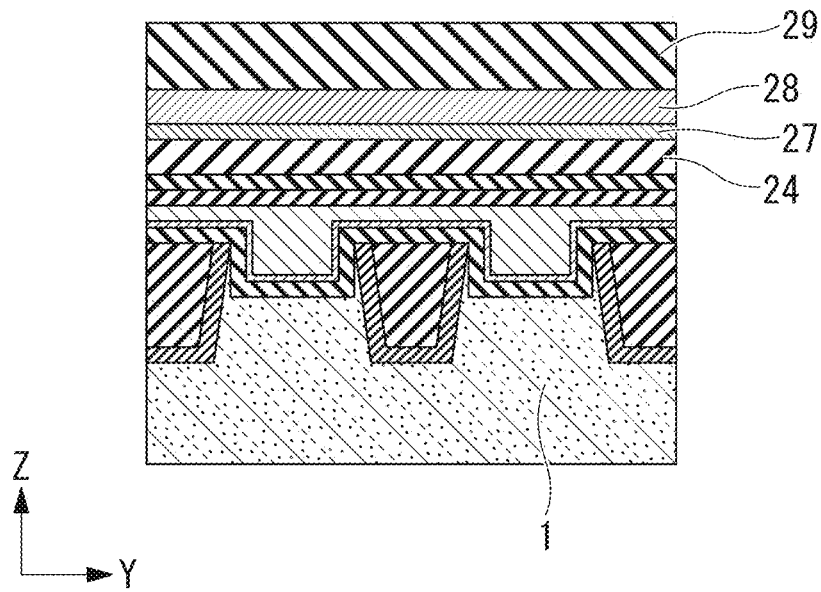
FIG. 18A is a fragmentary cross sectional elevation view of a step, subsequent to the step of FIGS. 17A and 17B, involved in a method of forming the DRAM, taken along the A-A' line of FIG. 1.
Figure 18B:
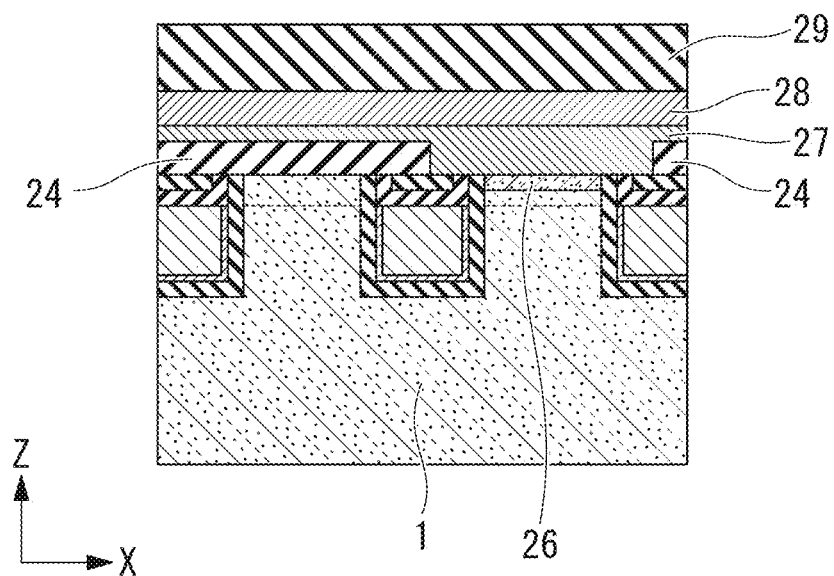
FIG. 18B is a fragmentary cross sectional elevation view of the same step as the step of FIG. 18A, involved in the method of forming the DRAM, taken along the B-B' line of FIG. 1.

As shown in FIGS. 18A and 18B, a lower conductive film is formed which covers the impurity diffusion layer 26 and the first inter-layer insulating film 24. A upper conductive film is formed on the lower conductive film. The stack of the lower and upper conductive films is a third conductive film which covers the impurity diffusion layer 26 and the first inter-layer insulating film 24. A mask film 29 is formed on the third conductive film.

The lower conductive film 27 may be a polysilicon film containing an n-type impurity such as phosphorus. The polysilicon film may be formed by a thermal chemical vapor deposition method. The lower conductive film 28 may be a tungsten (W) layer which can be formed by a sputtering method. The mask film 29 may be a silicon nitride film ($Si_3N_4$) which can be formed by a plasma chemical vapor deposition method.

Figure 19A:
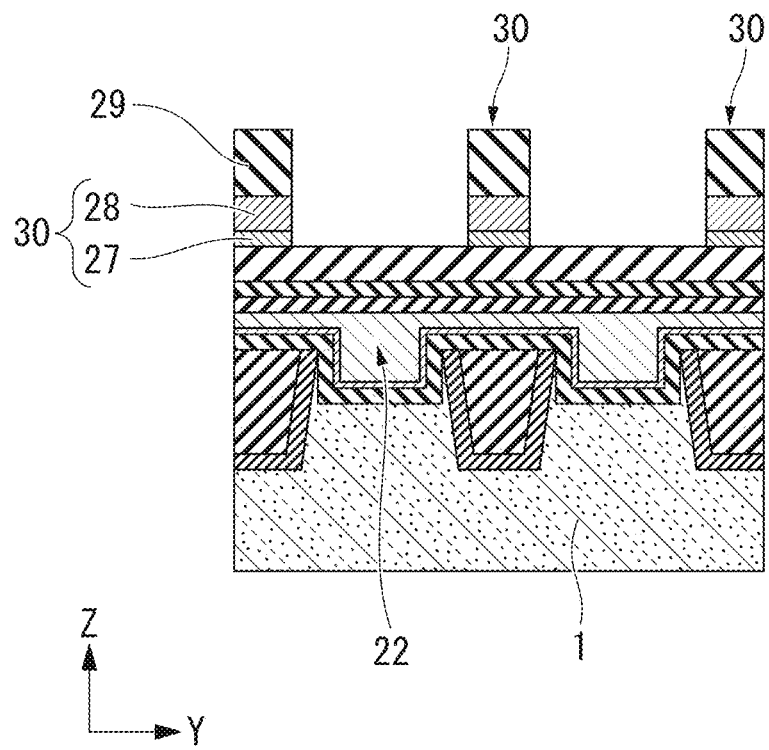
FIG. 19A is a fragmentary cross sectional elevation view of a step, subsequent to the step of FIGS. 18A and 18B, involved in a method of forming the DRAM, taken along the A-A' line of FIG. 1.
Figure 19B:
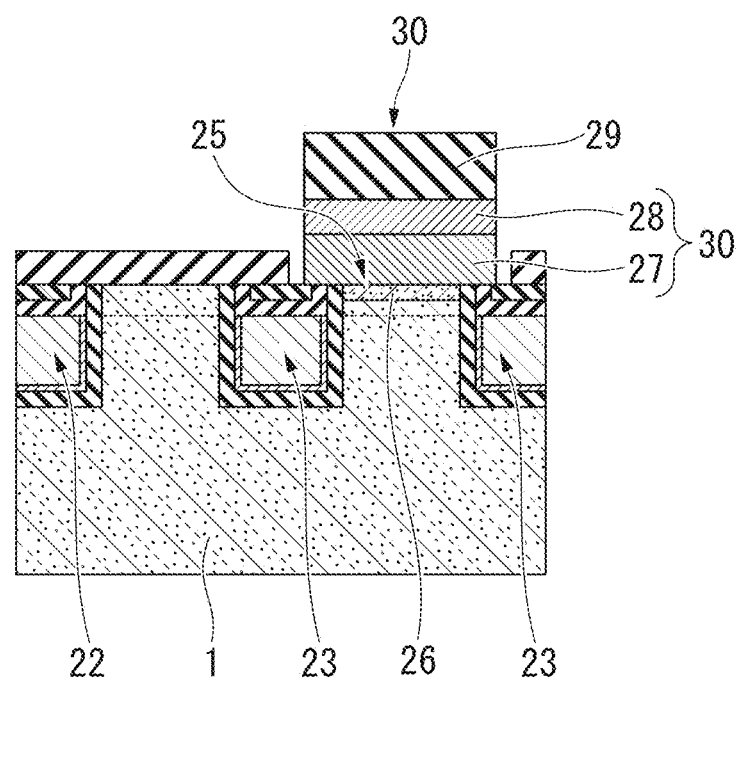
FIG. 19B is a fragmentary cross sectional elevation view of the same step as the step of FIG. 19A, involved in the method of forming the DRAM, taken along the B-B' line of FIG. 1.

As shown in FIGS. 19A and 19B, the stack of the lower conductive film 27, the upper conductive film 28 and the mask film 29 is patterned in a line pattern, to form bit lines 30 which each include the lower conductive film 27 and the upper conductive film 28.

Although each of the bit lines 30 includes the lower conductive film 27 and the upper conductive film 28, the stack of the bit lines 30 and the mask film 29 on the bit line 30 may simply be referred to as the bit line 30 hereinafter.

The bit lines 30 are formed in line patterns which extend in the X-direction and cross the buried word lines 23 in plan view. In FIG. 1, the bit lines 30 extend in straight form and cross the buried word lines 23 at right angle. It is possible as a modification that the bit lines 30 may extend in wave-form or curved-form.

The bot line 30 is connected to the diffusion layer 26 at the bit contact opening 25, wherein the diffusion layer 26 is to perform one of source and drain regions. For example, the lower conductive film 27 of the bit line 30 is connected to the diffusion region 26 in the bit contact opening 25. The bit line 30 is to perform not only the bit line but also a contact plug contacting to the diffusion region 26. The process in this embodiment is to form the bit line 30 performing both functions as bit line and bit contact by using a single lithography or a batch process to reduce the manufacturing processes.

(Formation of Capacitive Contact Plug)

Figure 20A:
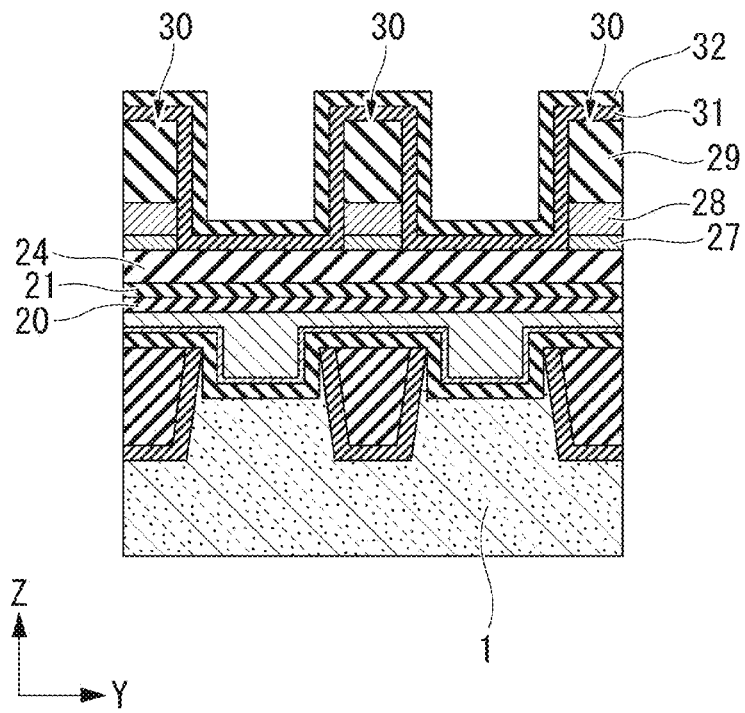
FIG. 20A is a fragmentary cross sectional elevation view of a step, subsequent to the step of FIGS. 19A and 19B, involved in a method of forming the DRAM, taken along the A-A' line of FIG. 1.
Figure 20B:
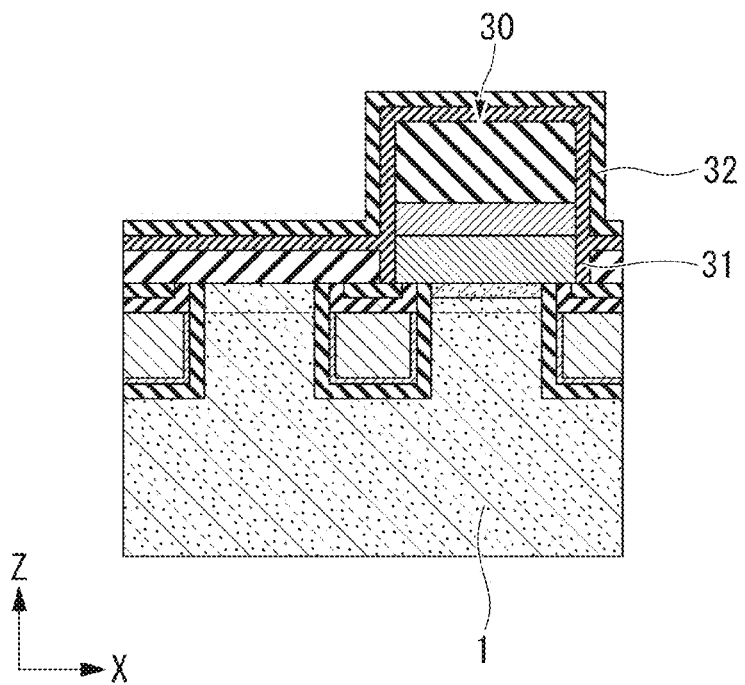
FIG. 20B is a fragmentary cross sectional elevation view of the same step as the step of FIG. 20A, involved in the method of forming the DRAM, taken along the B-B' line of FIG. 1.

As shown in FIGS. 20A and 20B, an insulating film 31 of silicon nitride is formed by a thermal chemical vapor deposition so that the insulating film 31 of silicon nitride which covers the first inter-layer insulating film 24 and the bit line 30. A liner film 32 is then formed which covers the insulating film 31.

The liner film 32 may be a silicon nitride film ($Si_3N_4$) which can be formed by a thermal chemical vapor deposition method.

The DRAM in this embodiment includes a peripheral circuit in the peripheral region arranged outside the memory cell region. In some cases, the peripheral circuit may include planer MOS transistors. In this case, the bit line 30 may also be configured to further perform a gate electrode of the planer MOS transistor, in addition to the both functions as bit line and bit contact. The stack of the insulating film 31 and the liner film 32 which covers the side wall of the bit line 30 can perform as a side wall of the gate electrode of the MOS transistor in the peripheral circuit.

Figure 21A:
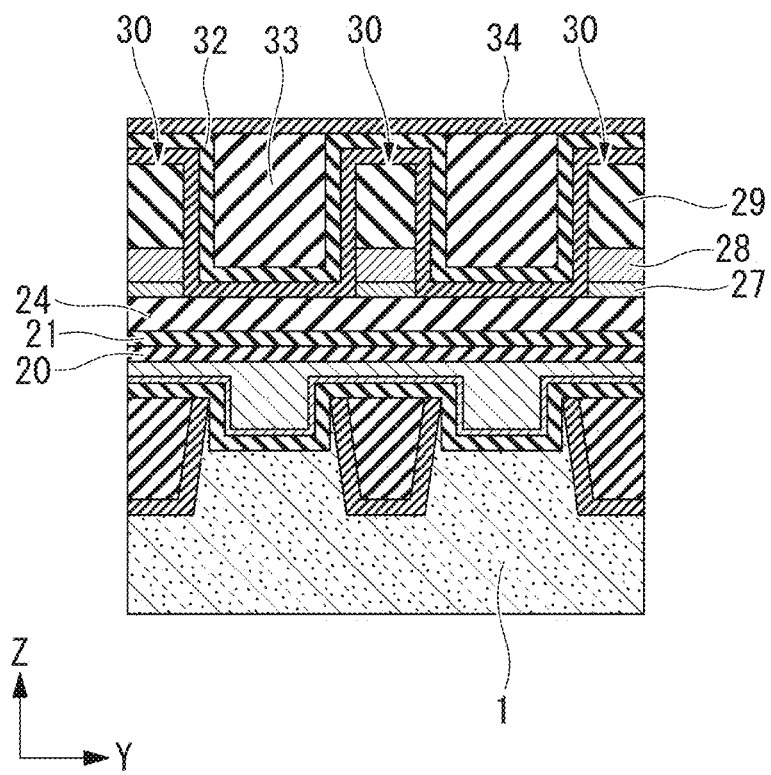
FIG. 21A is a fragmentary cross sectional elevation view of a step, subsequent to the step of FIGS. 20A and 20B, involved in a method of forming the DRAM, taken along the A-A' line of FIG. 1.
Figure 21B:
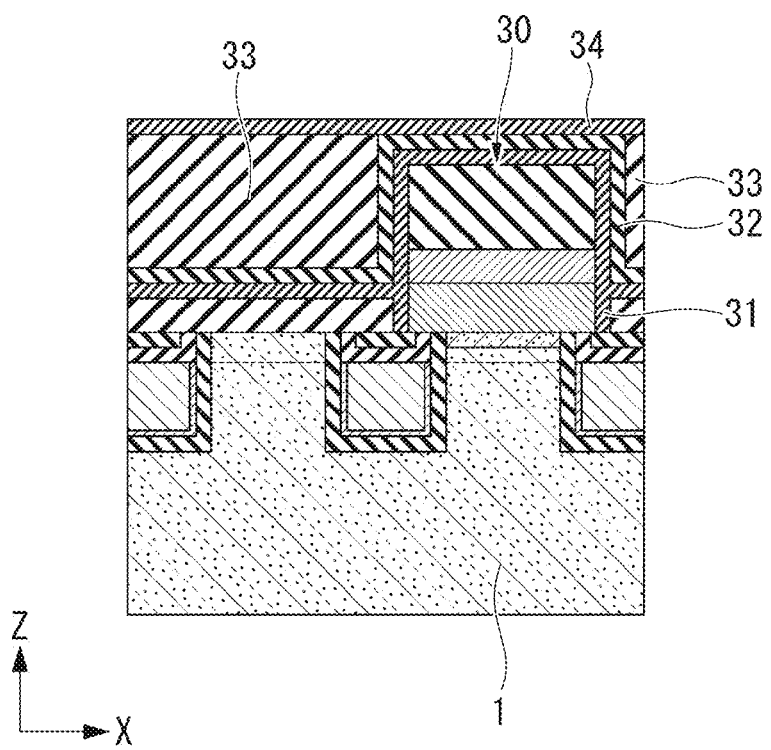
FIG. 21B is a fragmentary cross sectional elevation view of the same step as the step of FIG. 21A, involved in the method of forming the DRAM, taken along the B-B' line of FIG. 1.

As shown in FIGS. 21A and 21B, a spin-on-dielectric is coated on the liner film 32 to fill gaps between the bit lines 30. An annealing process is carried out at a high temperature and in a vapor atmosphere ($H_2O$) to make the spin-on-dielectric into a solid of a spin-on-dielectric film 33.

A chemical mechanical polishing process is carried out to remove the spin-on-dielectric film 33 so as to expose the upper surface of the liner film 32. A second inter-layer insulator film 34 is formed which covers the spin-on-dielectric film 33 and the liner film 32.

The second inter-layer insulator film 34 can be a silicon oxide film ($SiO_2$) which can be formed by a plasma chemical vapor deposition method.

Figure 22A:
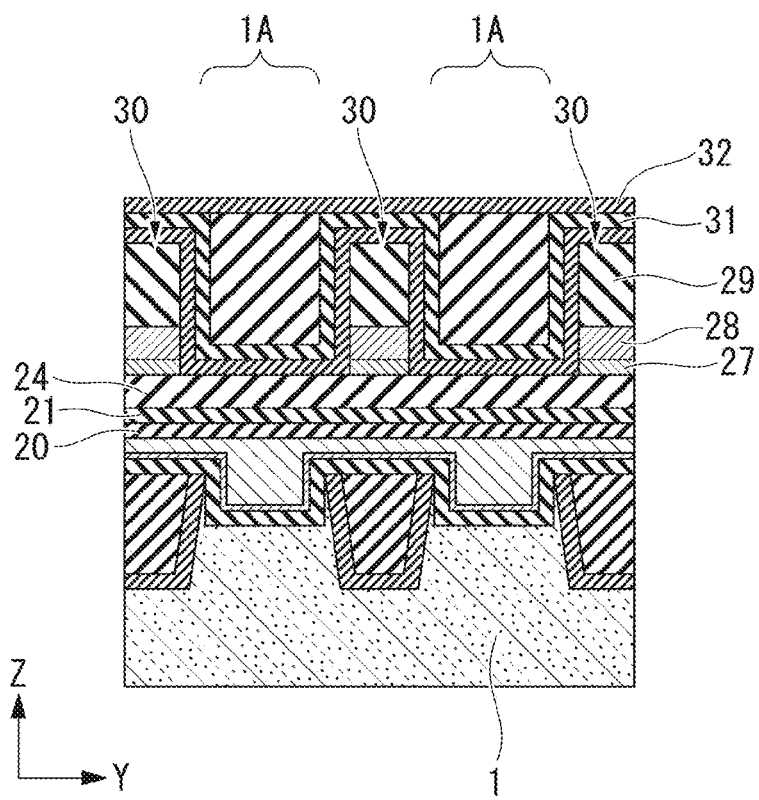
FIG. 22A is a fragmentary cross sectional elevation view of a step, subsequent to the step of FIGS. 21A and 21B, involved in a method of forming the DRAM, taken along the A-A' line of FIG. 1.
Figure 22B:
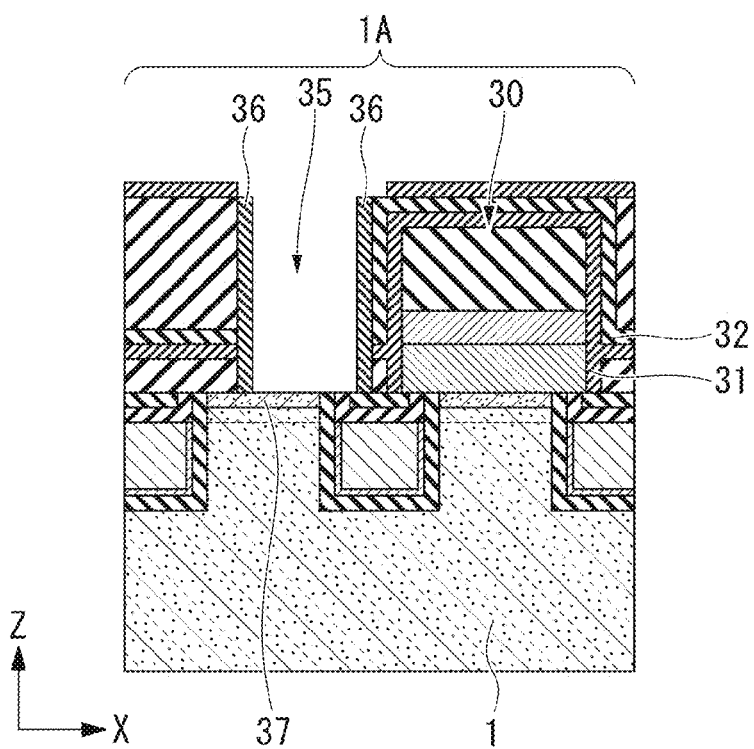
FIG. 22B is a fragmentary cross sectional elevation view of the same step as the step of FIG. 22A, involved in the method of forming the DRAM, taken along the B-B' line of FIG. 1.

As shown in FIGS. 22A and 22B, a lithography process and a dry etching process are carried out to form a capacitive contact opening 35. The capacitive contact opening 35 can be formed by a self-alignment contact method by using the stacks of the insulating film 31 and the liner film 32 as the side walls.

The surface of the semiconductor substrate 1 is exposed at a crossing position of the capacitive contact opening 35 and the active region 1A. A silicon nitride film is formed by a thermal chemical vapor deposition method so that the silicon nitride film covers the inner wall of the capacitive contact opening 35. The silicon nitride film is etched back to form side wall insulating films 36. An ion-implantation process is carried out by using the second inter-layer insulating film 34 as a mask to introduce an n-type impurity such as phosphorous into a shallow region of the semiconductor substrate 1 to form an n-type impurity diffusion layer 37 in the shallow region of the semiconductor substrate 1. The n-type impurity diffusion layer 37 is to perform the other of the source and drain regions.

Figure 23A:
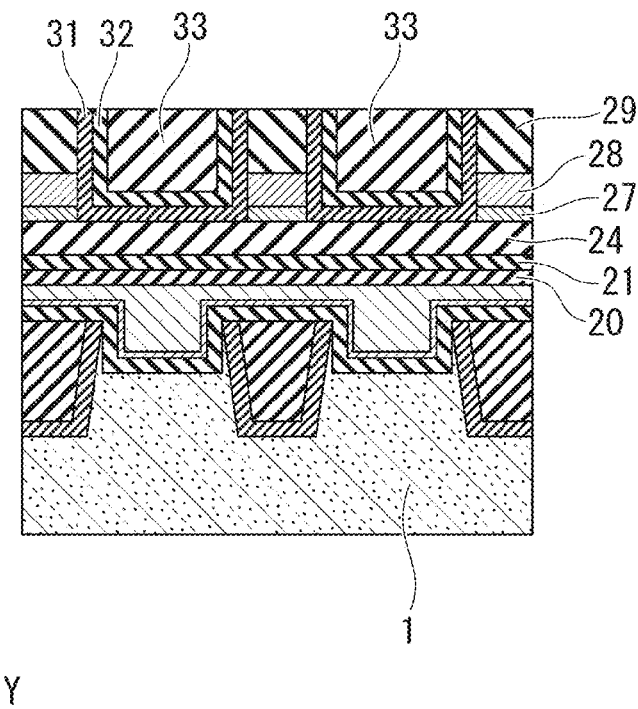
FIG. 23A is a fragmentary cross sectional elevation view of a step, subsequent to the step of FIGS. 22A and 22B, involved in a method of forming the DRAM, taken along the A-A' line of FIG. 1.
Figure 23B:
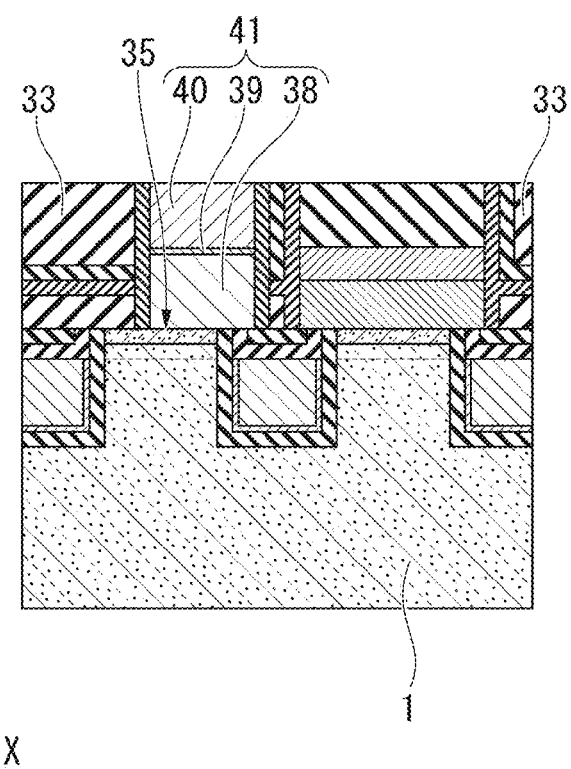
FIG. 23B is a fragmentary cross sectional elevation view of the same step as the step of FIG. 23A, involved in the method of forming the DRAM, taken along the B-B' line of FIG. 1.

As shown in FIGS. 23A and 23B, a phosphorous-containing polysilicon film is formed by a thermal chemical vapor deposition method so that the phosphorous-containing polysilicon film is disposed on the second inter-layer insulator film 34 and the phosphorous-containing polysilicon film fills the capacitive contact opening 35. The phosphorous-containing polysilicon film is etched back to form a lower conductive layer 38 of phosphorous-containing polysilicon at the bottom of the capacitive contact opening 35. An intervening layer 39 of cobalt silicide is formed by a sputtering method on the lower conductive layer 38. A tungsten film is formed to fill the capacitive contact opening 35 by a chemical vapor deposition method. A chemical mechanical polishing is carried out to planarize the tungsten film to expose the surface of the spin-on-dielectric film 33 and to have the tungsten film remain in the capacitive contact opening 35, thereby forming an upper conductive layer 40 of tungsten. As a result, a capacitive contact plug 41 are formed which includes the lower conductive layer 38, the intervening layer 39 and the upper conductive layer 40.

(Formation of Capacitor)

Figure 24A:
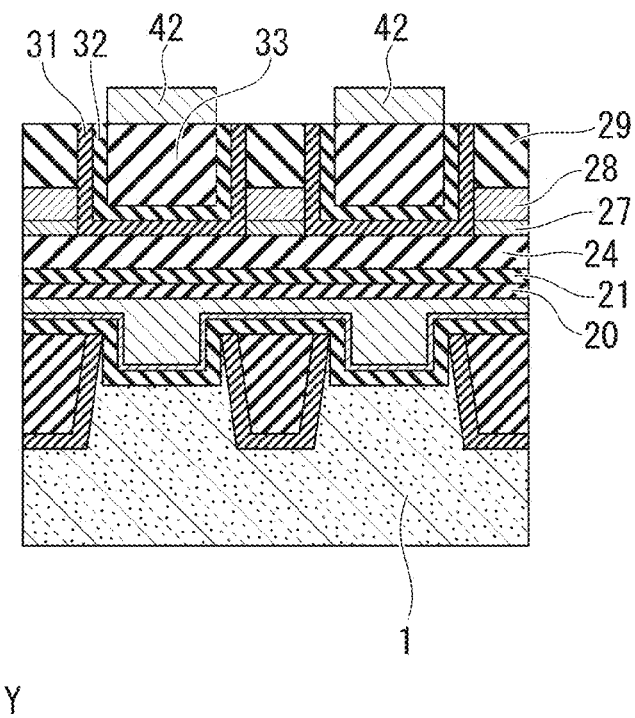
FIG. 24A is a fragmentary cross sectional elevation view of a step, subsequent to the step of FIGS. 23A and 23B, involved in a method of forming the DRAM, taken along the A-A' line of FIG. 1.
Figure 24B:
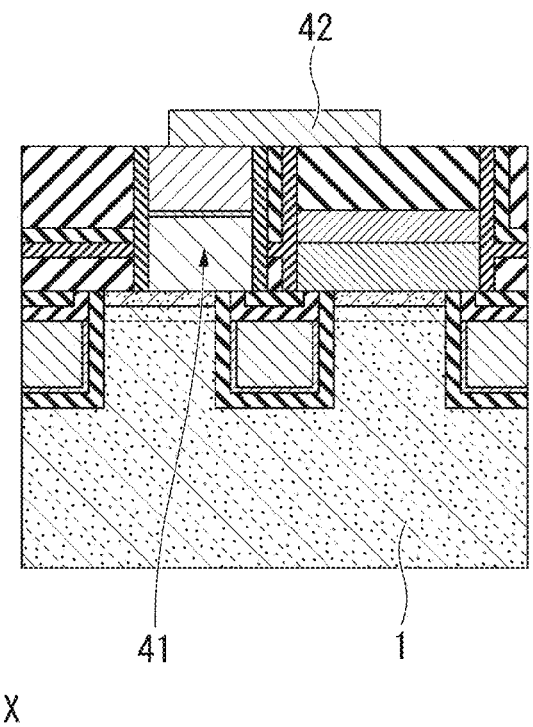
FIG. 24B is a fragmentary cross sectional elevation view of the same step as the step of FIG. 24A, involved in the method of forming the DRAM, taken along the B-B' line of FIG. 1.

As shown in FIGS. 24A and 24B, a capacitive contact pad 42 is formed over the wafer after the capacitive contact plug 41 is formed.

A tungsten nitride film is formed on the wafer by a sputtering method. A tungsten film is then formed on the tungsten nitride film by a sputtering method. The stack of the tungsten nitride film and the tungsten film is then patterned to form contact pads 42. The contact pads 42 are aligned at a constant pitch over the wafer. The center position of the contact pads 42 are displaced from the center position of the capacitive contact plug 41. The contact pads 42 partially overlap the capacitive contact plug 41 in plan view. The contact pads 42 are in contact with a part of the capacitive contact plug 41. Thus, the contact pads 42 are connected with the capacitive contact plug 41.

Figure 25A:
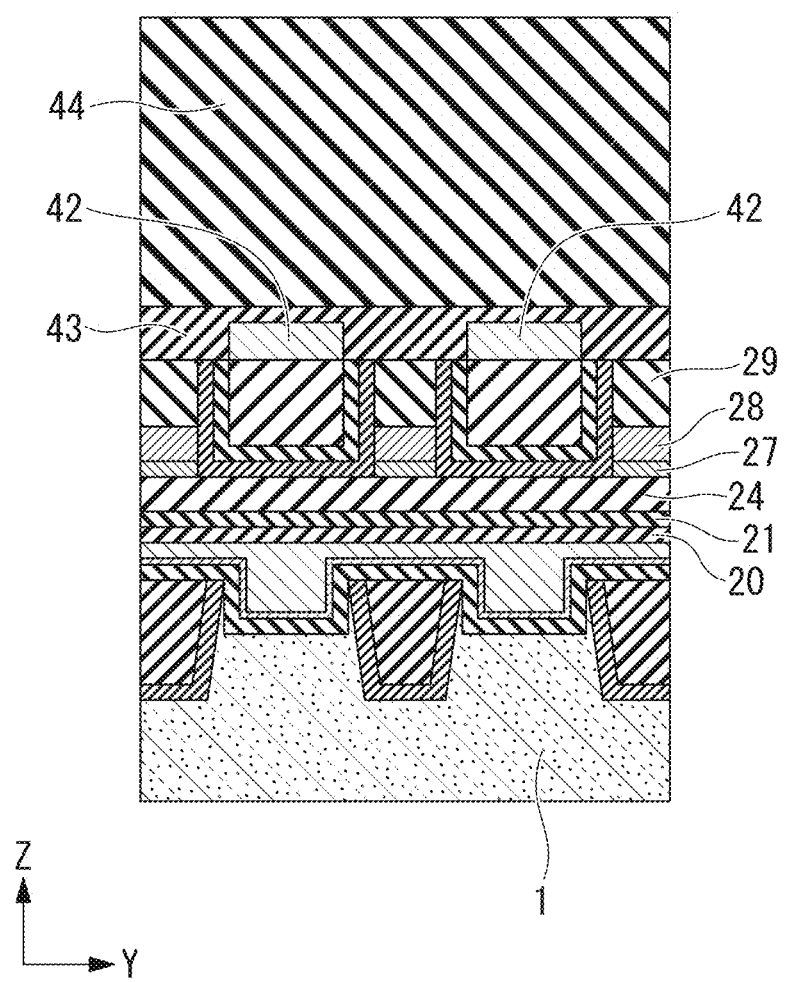
FIG. 25A is a fragmentary cross sectional elevation view of a step, subsequent to the step of FIGS. 24A and 24B, involved in a method of forming the DRAM, taken along the A-A' line of FIG. 1.
Figure 25B:
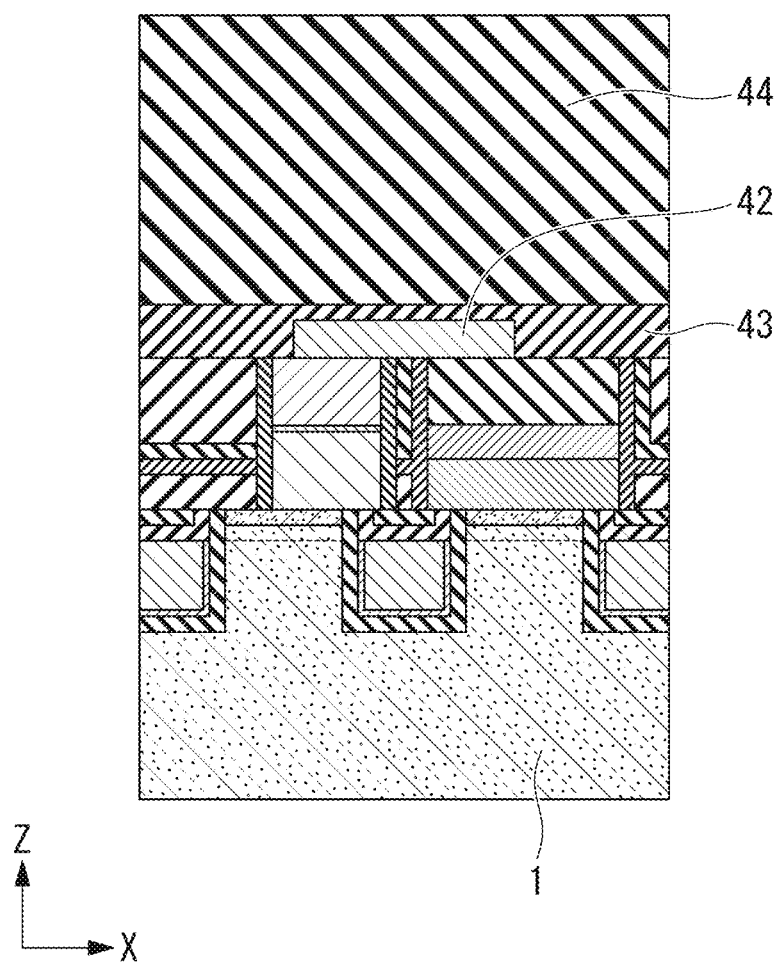
FIG. 25B is a fragmentary cross sectional elevation view of the same step as the step of FIG. 25A, involved in the method of forming the DRAM, taken along the B-B' line of FIG. 1.

As shown in FIGS. 25A and 25B, a stopper film 43 of silicon nitride is formed by a thermal chemical vapor deposition method so that the stopper film 43 of silicon nitride covers the contact pads 42 and the wafer 1. A third inter-layer insulating film 44 of silicon oxide is formed by a plasma chemical vapor deposition so that the third inter-layer insulating film 44 covers the stopper film 43 of silicon nitride.

Figure 26A:
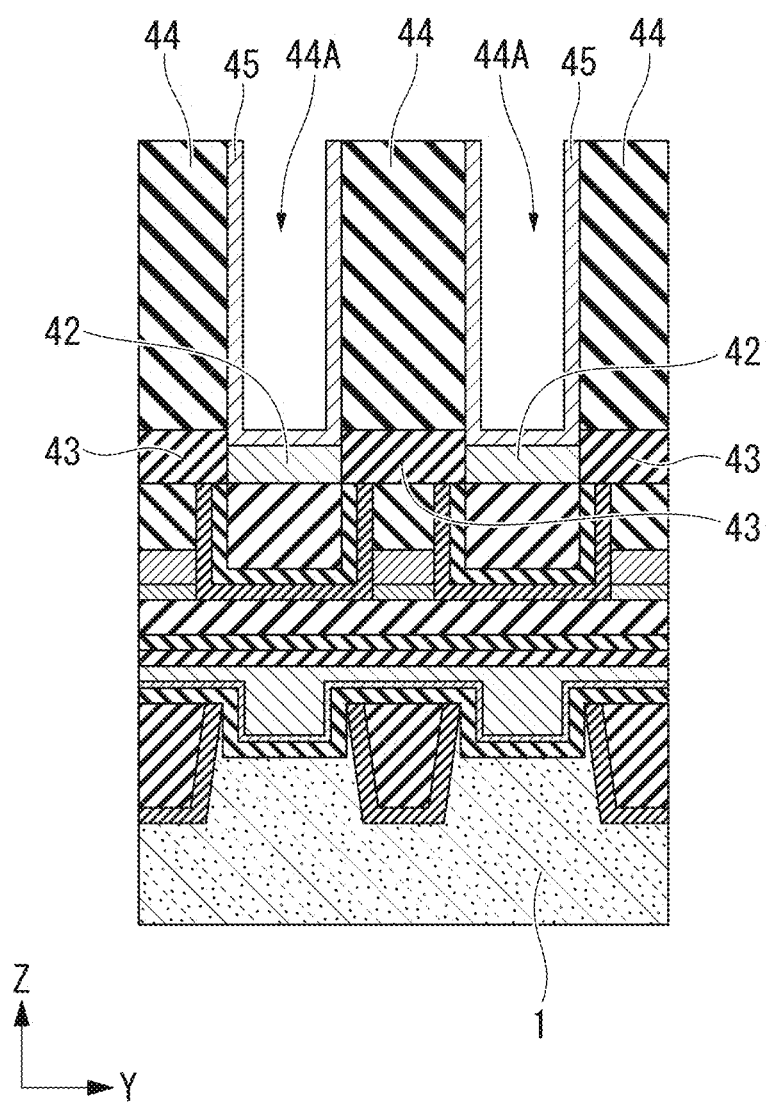
FIG. 26A is a fragmentary cross sectional elevation view of a step, subsequent to the step of FIGS. 25A and 25B, involved in a method of forming the DRAM, taken along the A-A' line of FIG. 1.
Figure 26B:
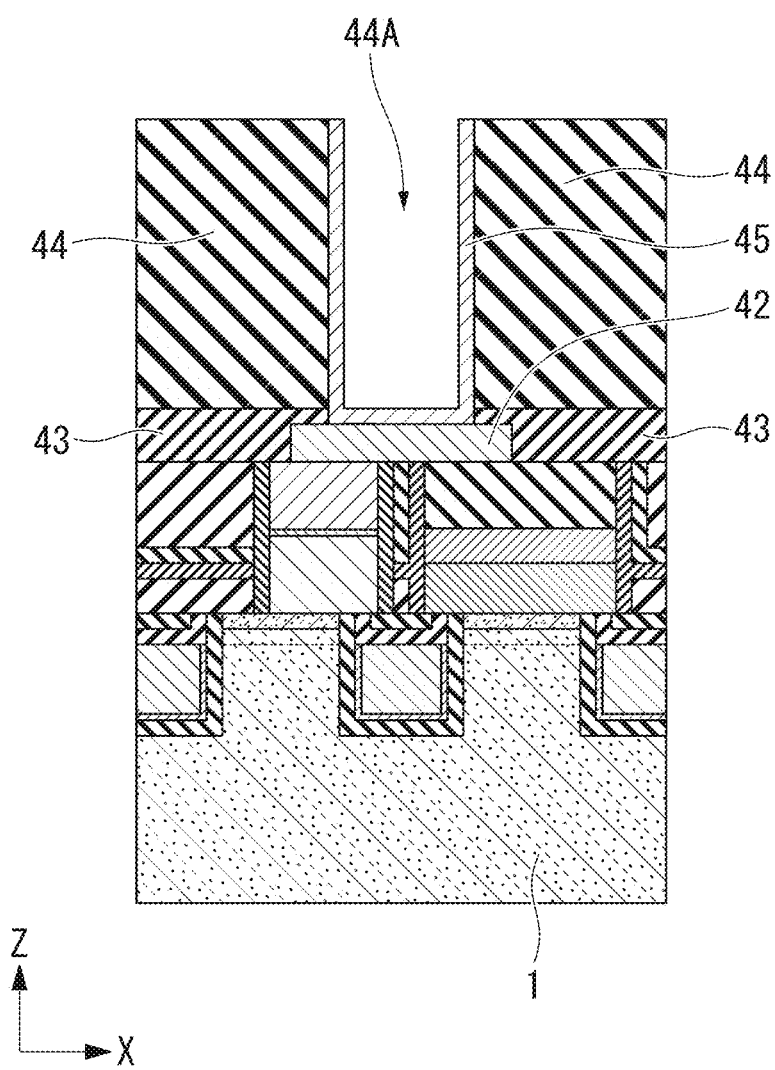
FIG. 26B is a fragmentary cross sectional elevation view of the same step as the step of FIG. 26A, involved in the method of forming the DRAM, taken along the B-B' line of FIG. 1.

As shown in FIGS. 26A and 26B, a lithography process and a dry etching process are carried out to form cylinder holes 44A which penetrate the third inter-layer insulating film 44 covers the stopper film 43 of silicon nitride, so that the cylinder holes 44A are positioned over the contact pads 42. The contact pads 42 are thus partially exposed. Bottom electrodes 45 of titanium nitride are formed by a chemical vapor deposition so that the bottom electrodes 45 cover the inner walls of the cylinder holes 44A and the upper surfaces of the contact pads 42. The bottom electrodes 45 are connected to the contact pads 42. The bottom electrodes 45 are in contact with the contact pads 42.

Figure 27A:
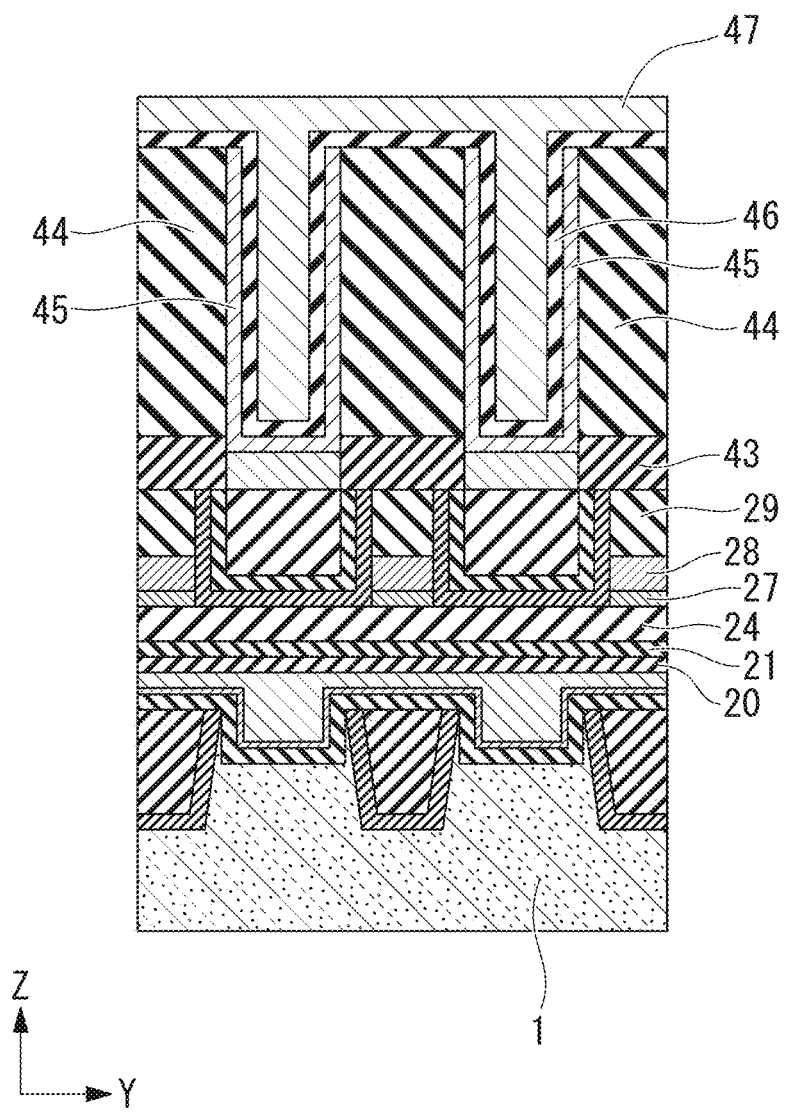
FIG. 27A is a fragmentary cross sectional elevation view of a step, subsequent to the step of FIGS. 26A and 26B, involved in a method of forming the DRAM, taken along the A-A' line of FIG. 1.
Figure 27B:
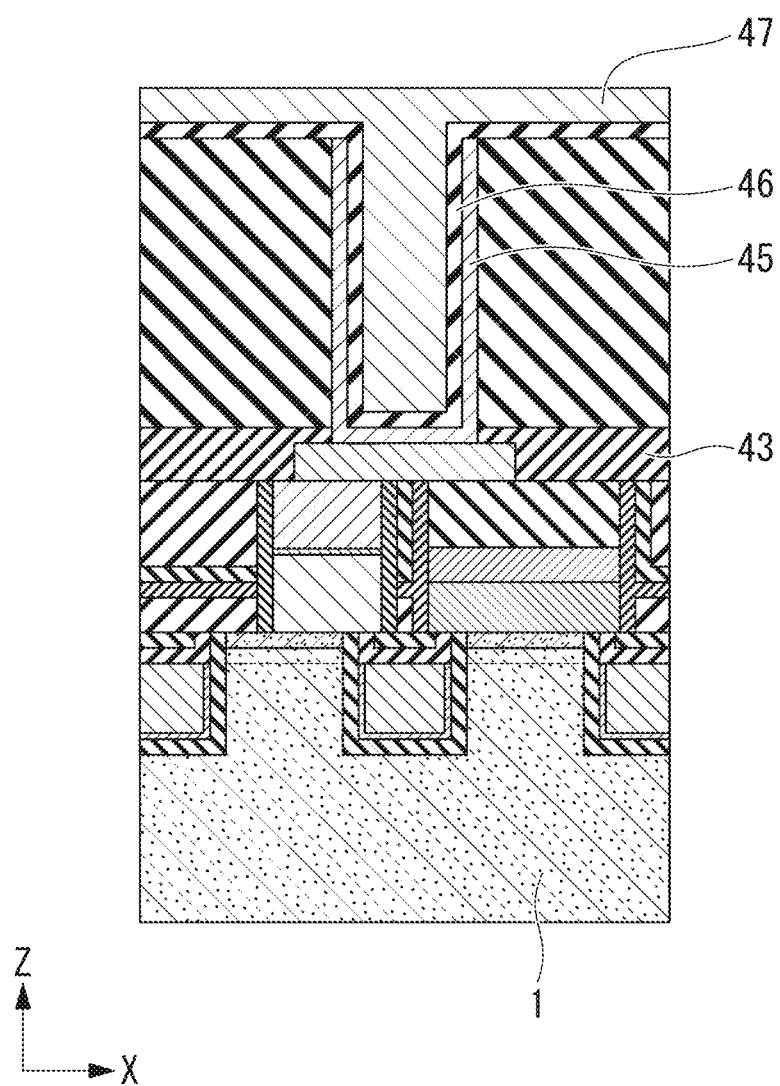
FIG. 27B is a fragmentary cross sectional elevation view of the same step as the step of FIG. 27A, involved in the method of forming the DRAM, taken along the B-B' line of FIG. 1.

As shown in FIGS. 27A and 27B, a capacitive insulating film 46 is formed by an atomic layer deposition method so that the capacitive insulating film 46 covers the third inter-layer insulating film 44 and the bottom electrodes 45.

In some cases, the capacitive insulating film 46 can be a zirconium oxide ($ZrO_2$) film. In other cases, the capacitive insulating film 46 can be an aluminum oxide ($Al_2O_3$) film. In still other cases, the capacitive insulating film 46 can be a hafnium oxide ($HfO_2$) film. In still other cases, the capacitive insulating film 46 can be a stack of two or three of the zirconium oxide ($ZrO_2$), the aluminum oxide ($Al_2O_3$) film and the hafnium oxide ($HfO_2$) film.

A top electrode 47 of titanium nitride is formed by a chemical vapor deposition method so that the top electrode 47 covers the capacitive insulating film 46, thereby forming capacitors which include the bottom electrodes 45, the capacitive insulating film 46 and the top electrode 47.

Figure 28A:
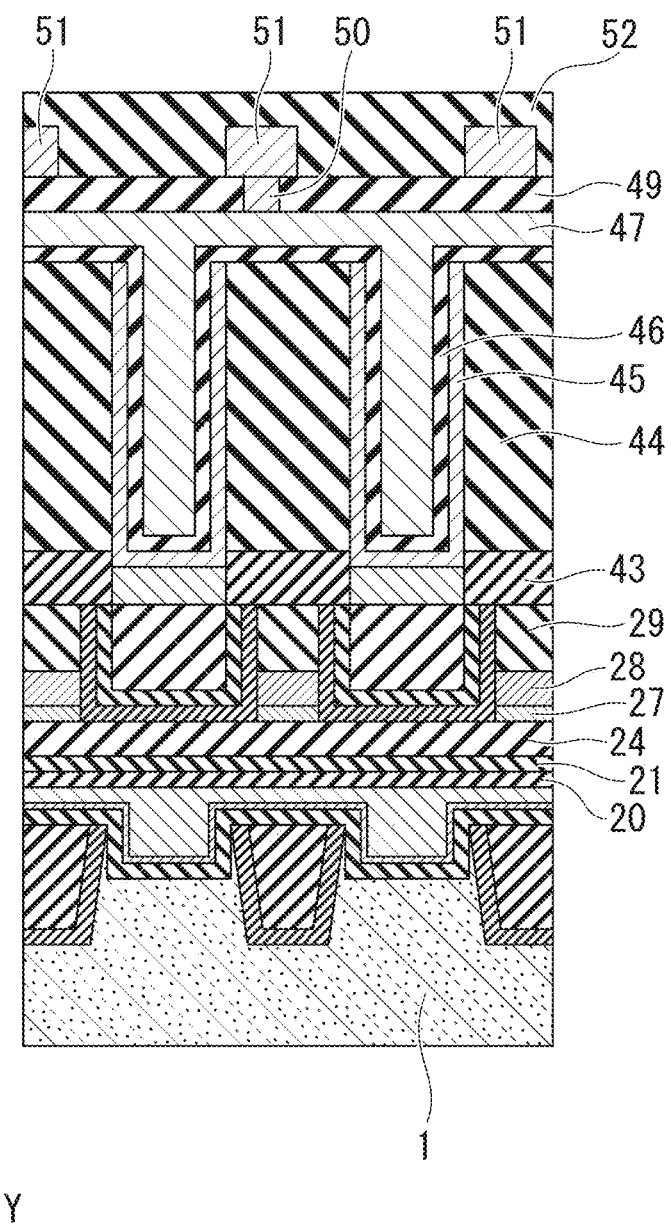
FIG. 28A is a fragmentary cross sectional elevation view of a step, subsequent to the step of FIGS. 27A and 27B, involved in a method of forming the DRAM, taken along the A-A' line of FIG. 1.
Figure 28B:
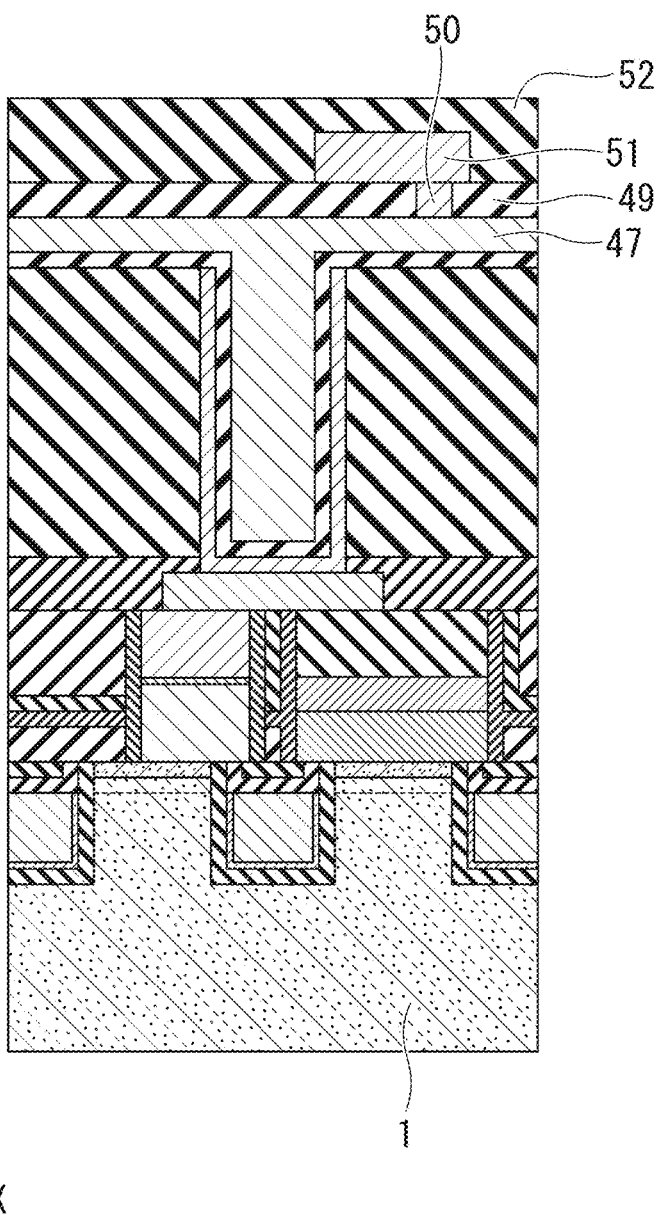
FIG. 28B is a fragmentary cross sectional elevation view of the same step as the step of FIG. 28A, involved in the method of forming the DRAM, taken along the B-B' line of FIG. 1.

As shown in FIGS. 28A and 28B, interconnects are formed over the capacitors. A fourth inter-layer insulating film 49 of silicon oxide is formed by a plasma chemical vapor deposition method so that the fourth inter-layer insulating film 49 covers the top electrode 47. A lithography process and a dry etching process are carried out to form a contact hole in the fourth inter-layer insulating film 49. A tungsten film is formed by a chemical vapor deposition method so that the tungsten film fills the contact hole and covers the fourth inter-layer insulating film 49. A chemical mechanical polishing process is carried out to remove the tungsten film over the fourth inter-layer insulating film 49 so as to have the tungsten film remain in the contact hole, thereby forming a contact plug 50 in the contact hole of the fourth inter-layer insulating film 49. A metal film of such as aluminum (Al) or copper (Cu) is formed over the fourth inter-layer insulating film 49 and the contact plug 50. The metal film is then patterned to form upper interconnects 51 over the fourth inter-layer insulating film 49 and the contact plug 50. The upper interconnect 51 is in contact with the contact plug 50. The upper interconnect 51 is connected through the contact plug 50 to the top electrode 47 of the capacitor.

A protection film is then formed over the upper interconnects 51 and the fourth inter-layer insulating film 49. As a result, the DRAM 100 is formed.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A method of forming a semiconductor device, the method comprising:
   forming a first groove in a semiconductor substrate;
   forming a first conductive film in the first groove and over the semiconductor substrate;
   planarizing the first conductive film over the semiconductor substrate;
   selectively etching the planarized first conductive film to have the planarized first conductive film remain in a lower portion of the first groove;
   forming a plurality of device isolation grooves in a main surface of the semiconductor substrate; and
   forming a plurality of device isolation films in the plurality of device isolation grooves to form a plurality of device isolation regions and to define at least one device formation region by the plurality of device isolation regions,
   wherein forming the first groove comprises forming the first groove which extends to cross the device formation region,
   wherein planarizing the first conductive film comprises:
   forming a planarizing film over the first conductive film; and
   carrying out a first etching process under a condition that an etching rate of the planarization film to an upper portion of the first conductive film is in the range of 0.5 to 1.5.

2. The method according to claim 1, wherein forming the first conductive film comprises:
   forming a first conductive layer in the first groove and over the semiconductor substrate; and
   forming a second conductive layer on the first conductive layer,
   wherein forming the planarization film comprises forming the planarization film on the second conductive layer.

3. The method according to claim 2, wherein carrying out the first etching process is carried out by removing the planarization film to expose the second conductive layer.

4. The method according to claim 3, wherein the first etching process is carried out under a first condition that a first etching rate of the planarization film to the second conductive layer is in the range of 0.5 to 1.5.

5. The method according to claim 4, further comprising:
   carrying out a second etching process for selectively etching the second conductive layer to have the second conductive layer remain in a lower portion of the first groove; and
   carrying out a third etching process for selectively etching the first conductive layer to have the first conductive layer remain in a lower portion of the first groove.

6. A method of forming a semiconductor device, the method comprising:
   forming a plurality of device isolation regions in a main surface of a semiconductor substrate, so that the plurality of device isolation regions define at least one device formation region;
   forming a first insulating film on at least a part of the main surface of the semiconductor substrate;
   forming a gate electrode groove by using the first insulating film as a mask, the gate electrode groove extending in a first direction crossing the plurality of device isolation regions;
   forming a gate insulating film on inside walls of the gate electrode groove;
   forming a first conductive layer on the gate insulating film, the first conductive layer being in the gate electrode groove;
   forming a second conductive layer on the first conductive layer, the second conductive layer filling in the gate electrode groove;
   forming a planarization film over the second conductive layer;
   carrying out a first etching process for etching the planarization film to expose the second conductive layer;
   carrying out a second etching process for selectively etching the second conductive layer to have the second conductive layer remain in a lower portion of the gate electrode groove; and
   carrying out a third etching process for selectively etching the first conductive layer to have the first conductive layer remain in the lower portion of the gate electrode groove.

7. The method according to claim 6, wherein the first etching process is carried out under a first condition that an etching rate of the planarization film to the second conductive layer is in the range of 0.5 to 1.5.

8. The method according to claim 6, wherein the second etching process is carried out under a second condition that etching rates of the second conductive layer to the gate insulating film and to the first conductive layer are at least 6.

9. The method according to claim 6, wherein the third etching process is carried out under a third condition that etching rates of the first conductive layer to the gate insulating film and to the first insulating film are at least 6.

10. The method according to claim 6, further comprising:
carrying out a fourth etching process for etching the first conductive layer so that a top portion of the first conductive layer is lower than a top portion of the second conductive layer, after carrying out the third etching process.

11. The method according to claim 10, wherein the fourth etching process is carried out under a fourth condition that etching rates of the first conductive layer to the gate insulating film and to the first insulating film are at least 6.

12. The method according to claim 10, wherein at least one of the second, third and fourth etching processes is carried out by carrying out a dry etching process without applying any bias to the semiconductor substrate.

13. The method according to claim 10, further comprising:
forming a first burying insulating film over the first and second conductive layers in the gate electrode groove, so that the first burying insulating film fills the gate electrode groove;
carrying out a chemical mechanical polishing process to polish the first burying insulating film, so that a top surface of the first burying insulating film is substantially equal to the surface of the semiconductor substrate;
forming a first inter-layer insulating film over the first burying insulating film and the semiconductor substrate;
forming a bit contact hole in the first inter-layer insulating film, the bit contact hole reaching the first burying insulating film and the device formation region, the bit contact hole extending in the first direction;
forming a third conductive layer in the bit contact hole and over the first inter-layer insulating film; and
patterning the third conductive layer over the first inter-layer insulating film to form a bit line which partially overlapping the first burying insulating film so that the bit line is connected to the device formation region.

14. The method according to claim 13, further comprising:
forming a capacitive contact plug in the first inter-layer insulating film, the capacitive contact plug partially overlapping the first burying insulating film, the capacitive contact plug being adjacent to the bit line.

15. The method according to claim 14, further comprising:
forming a capacitor connected to the capacitive contact plug.

16. The method according to claim 6, wherein forming the planarization film comprises forming a polymer film over the second conductive layer.

17. The method according to claim 16, wherein forming the polymer film comprises forming a polyphenol resin film over the second conductive layer.

18. The method according to claim 6, wherein forming the polymer film comprises coating a polymer on the second conductive layer.

19. A method of forming a semiconductor device, the method comprising:
forming a groove in a semiconductor substrate;
forming a conductive film in the groove and over the semiconductor substrate;
forming a planarizing film over the conductive film;
etching the planarizing film and a part of the conductive film over the semiconductor substrate to planarize the conductive film; and
selectively etching the conductive film to remain the conductive film in a lower portion of the groove.

20. The method according to claim 19, wherein the conductive film comprises a first conductive film and a second conductive film,
wherein etching the planarizing film and the part of the conductive film comprises etching the planarizing film and a part of the first conductive film over the semiconductor substrate to planarize the first conductive film without etching the second conductive film, and
wherein selectively etching the conductive film comprises selectively etching the first and second conductive films to remain the first and second conductive films on a lower portion of the groove.

* * * * *